United States Patent
Seo et al.

(10) Patent No.: US 11,901,358 B2
(45) Date of Patent: Feb. 13, 2024

(54) SEMICONDUCTOR DEVICE WITH GATE ELECTRODE WITH FLAT UPPER SURFACE AND NO PROTRUDING PORTION AND METHODS OF MANUFACTURING THE SAME

(71) Applicant: SAMSUNG ELECTRONICS CO., LTD., Suwon-si (KR)

(72) Inventors: Myungsoo Seo, Suwon-si (KR); Sangjung Kang, Suwon-si (KR); Juyoun Kim, Suwon-si (KR); Seulgi Yun, Hwaseong-si (KR); Seki Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 17/497,449

(22) Filed: Oct. 8, 2021

(65) Prior Publication Data

US 2022/0344329 A1    Oct. 27, 2022

(30) Foreign Application Priority Data

Apr. 21, 2021    (KR) .................. 10-2021-0051954

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
CPC ......... H01L 27/0886; H01L 21/823431; H01L 29/41791; H01L 29/66795; H01L 29/6681;
(Continued)

(56) References Cited

U.S. PATENT DOCUMENTS 6,727,160 B1 * 4/2004 Huang .............. H01L 21/76224
257/E21.546
9,520,482 B1    12/2016 Chang et al.
(Continued)

FOREIGN PATENT DOCUMENTS

KR    10-2020-0029743    3/2020

OTHER PUBLICATIONS

Extended Europrean Search Report dated Jul. 22, 2022 for Application Serial No. 22151280.9.

*Primary Examiner* — Sonya McCall-Shepard
(74) *Attorney, Agent, or Firm* — F. CHAU & ASSOCIATES, LLC

(57) ABSTRACT

A method of manufacturing a semiconductor device includes forming a dummy gate structure on a substrate, partially removing the dummy gate structure to form a first opening that divides the dummy gate structure, forming a first division pattern structure in the first opening, replacing the dummy gate structure with a gate structure, removing the first division pattern structure to form a second opening, removing a portion of the gate structure from a sidewall of the second opening to enlarge the second opening, and forming a second division pattern in the enlarged second opening.

17 Claims, 34 Drawing Sheets

(51) Int. Cl.
*H01L 29/08* (2006.01)
*H01L 29/417* (2006.01)
*H01L 29/66* (2006.01)

(52) U.S. Cl.
CPC ............... *H01L 21/823475* (2013.01); *H01L 21/823481* (2013.01); *H01L 29/0847* (2013.01); *H01L 29/41791* (2013.01); *H01L 29/66545* (2013.01)

(58) Field of Classification Search
CPC ............. H01L 21/762; H01L 21/76224; H01L 29/0649; H01L 21/823481; H01L 29/66545; H01L 21/823437; H01L 21/823842; H01L 21/82345; H01L 21/823475; H01L 21/823462; H01L 21/823864; H01L 21/31051; H01L 21/31105; H01L 21/823468; H01L 29/0847; H01L 21/823418; H01L 27/088
See application file for complete search history.

(56) References Cited

U.S. PATENT DOCUMENTS

| | | |
|---|---|---|
| 10,176,995 B1 | 1/2019 | Wu et al. |
| 10,453,936 B2 | 10/2019 | Shu et al. |
| 10,586,860 B2 | 3/2020 | Shu et al. |
| 10,770,559 B2 | 9/2020 | Liang et al. |
| 10,825,913 B2 | 11/2020 | Zang et al. |
| 2016/0005658 A1* | 1/2016 | Lin ................... H01L 29/66545 438/591 |
| 2018/0323277 A1* | 11/2018 | Zhou ................ H01L 29/41791 |
| 2019/0333822 A1 | 10/2019 | Lin et al. |
| 2019/0341468 A1 | 11/2019 | Zang et al. |
| 2020/0083220 A1* | 3/2020 | Park ...................... H01L 29/785 |
| 2020/0083222 A1 | 3/2020 | Kim et al. |
| 2020/0176258 A1 | 6/2020 | Zang et al. |
| 2020/0411386 A1 | 12/2020 | Huang et al. |

\* cited by examiner

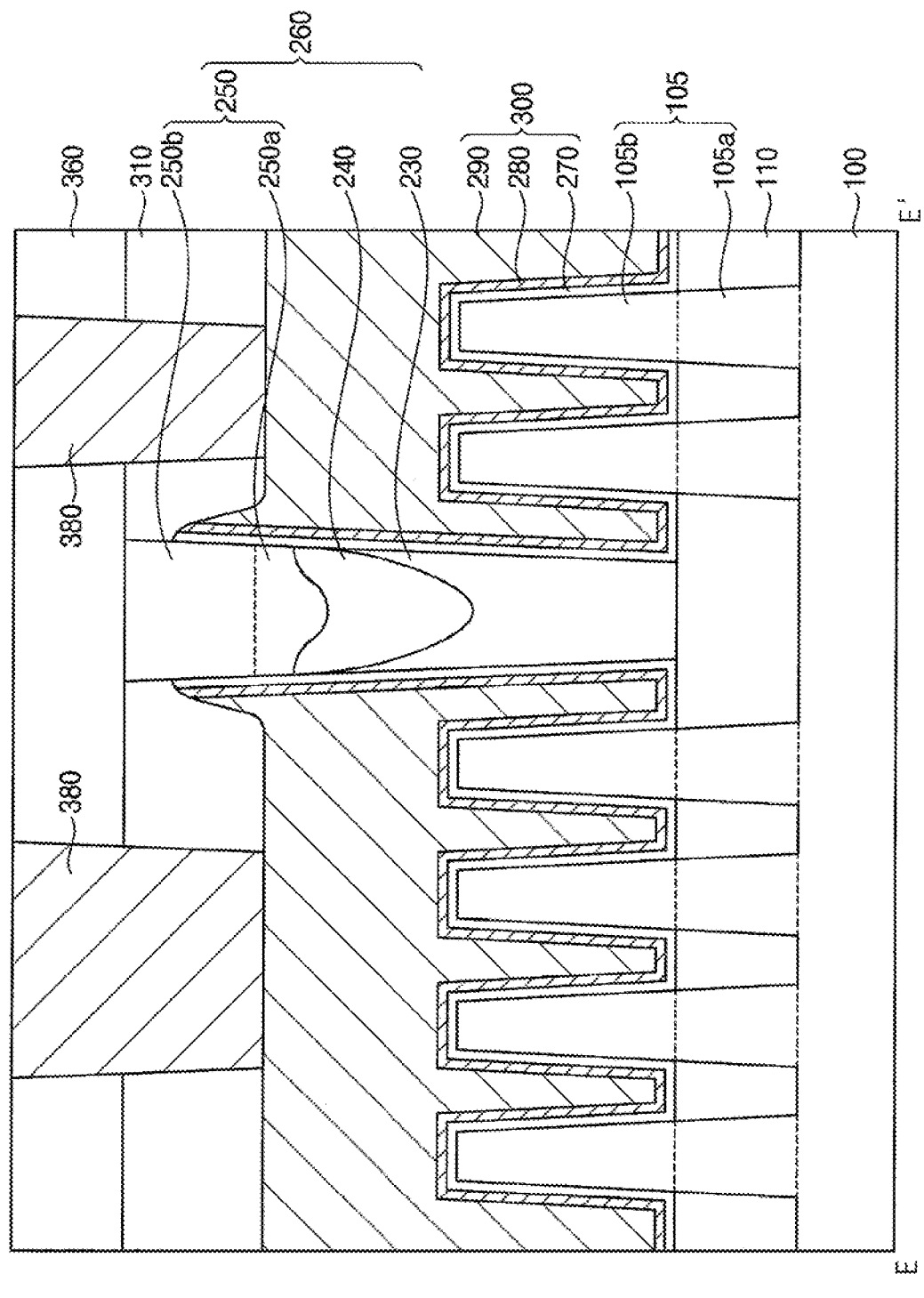
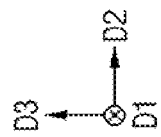

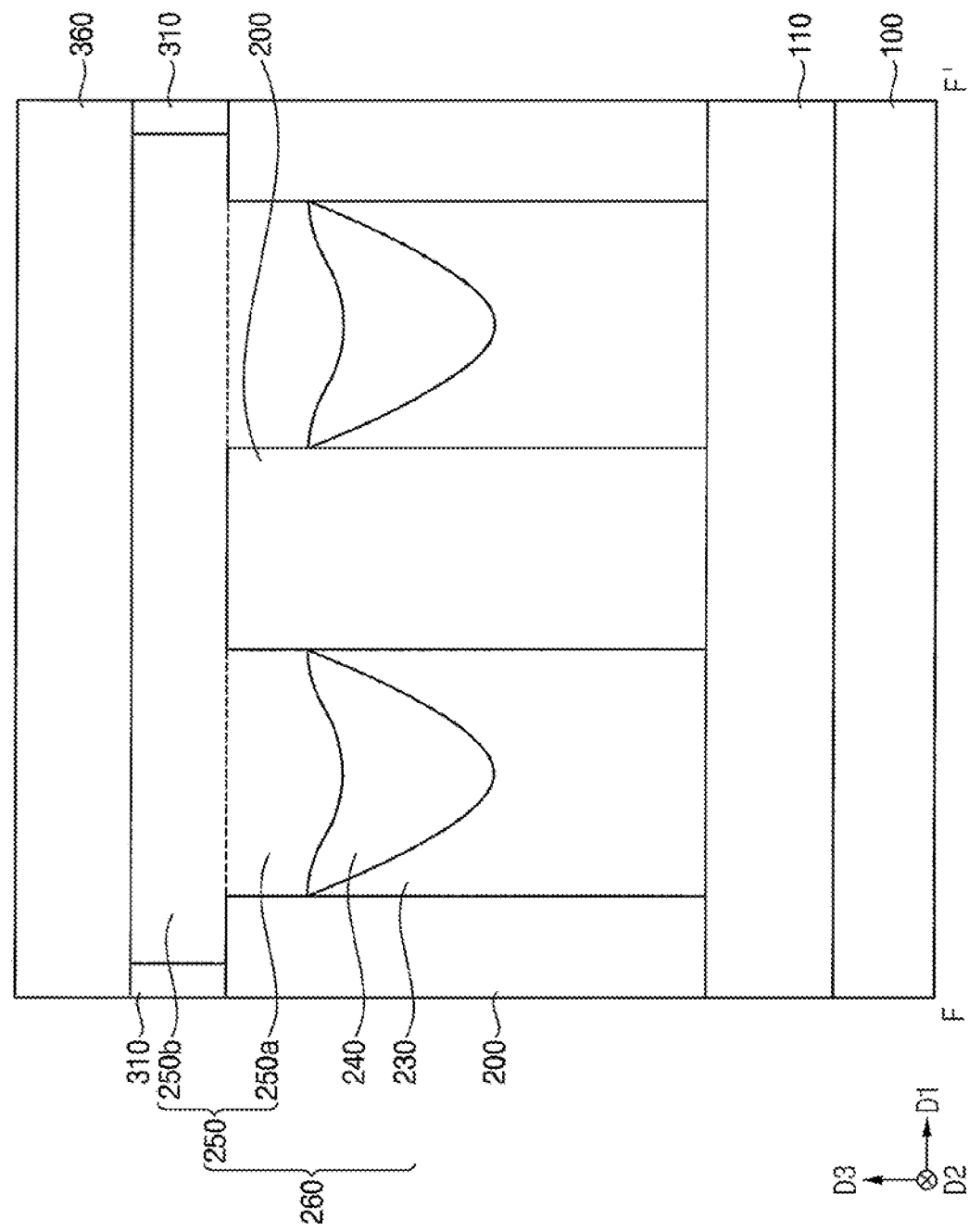

SEMICONDUCTOR DEVICE WITH GATE ELECTRODE WITH FLAT UPPER SURFACE AND NO PROTRUDING PORTION AND METHODS OF MANUFACTURING THE SAME

CROSS-REFERENCE TO RELATED APPLICATION

This application claims priority under 35 USC § 119 from Korean Patent Application No. 10-2021-0051954, filed on Apr. 21, 2021 in the Korean Intellectual Property Office (KIPO), the contents of which are herein incorporated by reference in their entirety.

BACKGROUND

1. Technical Field

Embodiments of the present disclosure are directed to semiconductor devices and methods of manufacturing the same. More particularly, embodiments relate to semiconductor devices including metal gate electrodes and methods of manufacturing the same.

2. Discussion of the Related Art

As semiconductor devices become more integrated, electrical shorts between conductive structures in the semiconductor device increase. For example, if a distance between a gate electrode and a contact plug is small, a method of reducing an electrical short or interference between the gate electrode and the contact plug is needed.

SUMMARY

Embodiments provide a method of manufacturing a semiconductor device that has enhanced characteristics.

Embodiments provide a semiconductor device that has enhanced characteristics.

According to some embodiments, there is provided a method of manufacturing a semiconductor device. The method includes forming a dummy gate structure on a substrate, partially removing the dummy gate structure to form a first opening that divides the dummy gate structure, forming a first division pattern structure in the first opening, replacing the dummy gate structure with a gate structure, removing the first division pattern structure to form a second opening, removing a portion of the gate structure from a sidewall of the second opening to enlarge the second opening, and forming a second division pattern in the enlarged second opening.

According to some embodiments, there is provided a method of manufacturing a semiconductor device. The method includes forming an isolation pattern on a substrate to define an active pattern that extends in a first direction on the substrate. The first direction is substantially parallel to an upper surface of the substrate, and a lower sidewall of the active pattern is covered by the isolation pattern. The method further includes forming a dummy gate structure on the active pattern and the isolation pattern. The dummy gate structure extends in a second direction substantially parallel to the upper surface of the substrate and that crosses the first direction. The method further includes removing a portion of the dummy gate structure from the isolation pattern to form a first opening that divides the dummy gate structure in the second direction, forming a first division pattern structure in the first opening, replacing the dummy gate structure with a gate structure, removing the first division pattern structure to form a second opening, and forming a second division pattern in the second opening.

According to some embodiments, there is provided a method of manufacturing a semiconductor device. The method includes forming an isolation pattern on a substrate to define an active pattern and to cover a lower sidewall of the active pattern, forming a dummy gate structure on the active pattern and the isolation pattern, forming a source/drain layer on a portion of the active pattern adjacent to the dummy gate structure, forming an insulating interlayer on the active pattern and the isolation pattern to cover the dummy gate structure and the source/drain layer, partially removing an upper portion of the insulating interlayer and the dummy gate structure to form a first opening that divides the dummy gate structure, forming a first division pattern structure in the first opening, removing the dummy gate structure to form a second opening, forming a gate structure in the second opening, removing the first division pattern structure to form a third opening, removing a portion of the gate structure from a sidewall of the third opening to enlarge the third opening, forming a second division pattern in the third opening, and forming a contact plug through the insulating interlayer that is electrically connected to the source/drain layer.

According to some embodiments, there is provided a semiconductor device. The semiconductor device includes active patterns, an isolation pattern, a gate structure, and a division pattern. Each of the active patterns protrudes from a substrate and extends in a first direction substantially parallel to an upper surface of the substrate. The isolation pattern is disposed on the substrate that covers a lower sidewall of each of the active patterns. The gate structure extends in a second direction on the active patterns and the isolation pattern. The second direction is substantially parallel to the upper surface of the substrate and crosses the first direction. The division pattern is formed on the isolation pattern, and contacts an end portion in the second direction of the gate structure. The gate structure includes a gate insulation pattern, a gate barrier and a gate electrode that are sequentially stacked. The gate insulation pattern and the gate barrier are not formed on a sidewall of the division pattern, and the gate electrode contacts the sidewall of the division pattern. The gate insulation pattern, the gate barrier and the gate electrode are sequentially stacked on an upper surface of a portion of the isolation pattern adjacent to the sidewall of the division pattern, and the gate insulation pattern contacts the upper surface of the portion of the isolation pattern.

According to some embodiments, there is provided a semiconductor device. The semiconductor device includes first and second active patterns, an isolation pattern, a first gate structure, a second gate structure, a first division pattern structure, and a second division pattern. The first and second active patterns are formed on first and second regions of the substrate, respectively, and each of the first and second active patterns protrudes from the substrate and extends in a first direction substantially parallel to an upper surface of the substrate. The isolation pattern is disposed on the substrate that covers lower sidewalls of the first and second active patterns. The first gate structure extends in a second direction on the first active patterns and the isolation pattern. The second direction is substantially parallel to the upper surface of the substrate and crosses the first direction. The second gate structure extends in the second direction on the second active patterns and the isolation pattern. The first division pattern structure is formed on the first region of the substrate, and contacts a sidewall of an end portion in the second direction of the first gate structure. The second division pattern is formed on the second region of the substrate, and contacts a sidewall of an end portion in the second direction of the second gate structure. An uppermost surface of the first gate structure is higher than an uppermost surface of the second gate structure.

According to some embodiments, there is provided a semiconductor device. The semiconductor device includes active patterns, an isolation pattern, a gate structure, a division pattern, a source/drain, and a contact plug. Each of the active patterns protrudes from a substrate and extends in a first direction substantially parallel to an upper surface of the substrate. The isolation pattern is disposed on the substrate and covers a lower sidewall of each of the active patterns. The gate structure extends in a second direction on the active patterns and the isolation pattern. The second direction is substantially parallel to the upper surface of the substrate and crosses the first direction. The division pattern is formed on the isolation pattern, and extends through the gate structure and divides the gate structure in the second direction. The source/drain layer is formed on each of the active patterns adjacent to the gate structure. The contact plug is formed on the source/drain layer, and is electrically connected to the source/drain layer. The gate structure includes a gate insulation pattern, a gate barrier and a gate electrode that are sequentially stacked. The gate insulation pattern and the gate barrier are not formed on a sidewall of the division pattern, and the gate electrode contacts the sidewall of the division pattern. The gate insulation pattern, the gate barrier and the gate electrode are sequentially stacked on an upper surface of a portion of the isolation pattern adjacent to the sidewall of the division pattern, and the gate insulation pattern contacts the upper surface of the portion of the isolation pattern.

In a semiconductor device in accordance with embodiments, a first division pattern is formed that divides a dummy gate structure, a dummy gate electrode is replaced with a gate electrode, the first division pattern is removed to form a second division pattern, and a portion of the gate electrode on the second division pattern that protrudes from other portions is additionally removed.

Accordingly, the gate electrode can have a flat upper surface, and electrical shorts or interference with neighboring contact plugs can be reduced.

BRIEF DESCRIPTION OF THE DRAWINGS

FIGS. 32 to 34 are a plan view and cross-sectional views that illustrate a semiconductor device in accordance with embodiments.

DETAILED DESCRIPTION

Semiconductor devices and methods of manufacturing the same in accordance with embodiments will be described more fully hereinafter with reference to the accompanying drawings.

FIGS. 1 to 31 are plan views and cross-sectional views that illustrate a method of manufacturing a semiconductor device in accordance with embodiments. In particular, FIGS. 1, 4, 7, 10, 13, 16, 24 and 27 are plan views, and FIGS. 2-3, 5-6, 8-9, 11-12, 14-15, 17-23, 25-26 and 28-31 are cross-sectional views.

Figure 5:
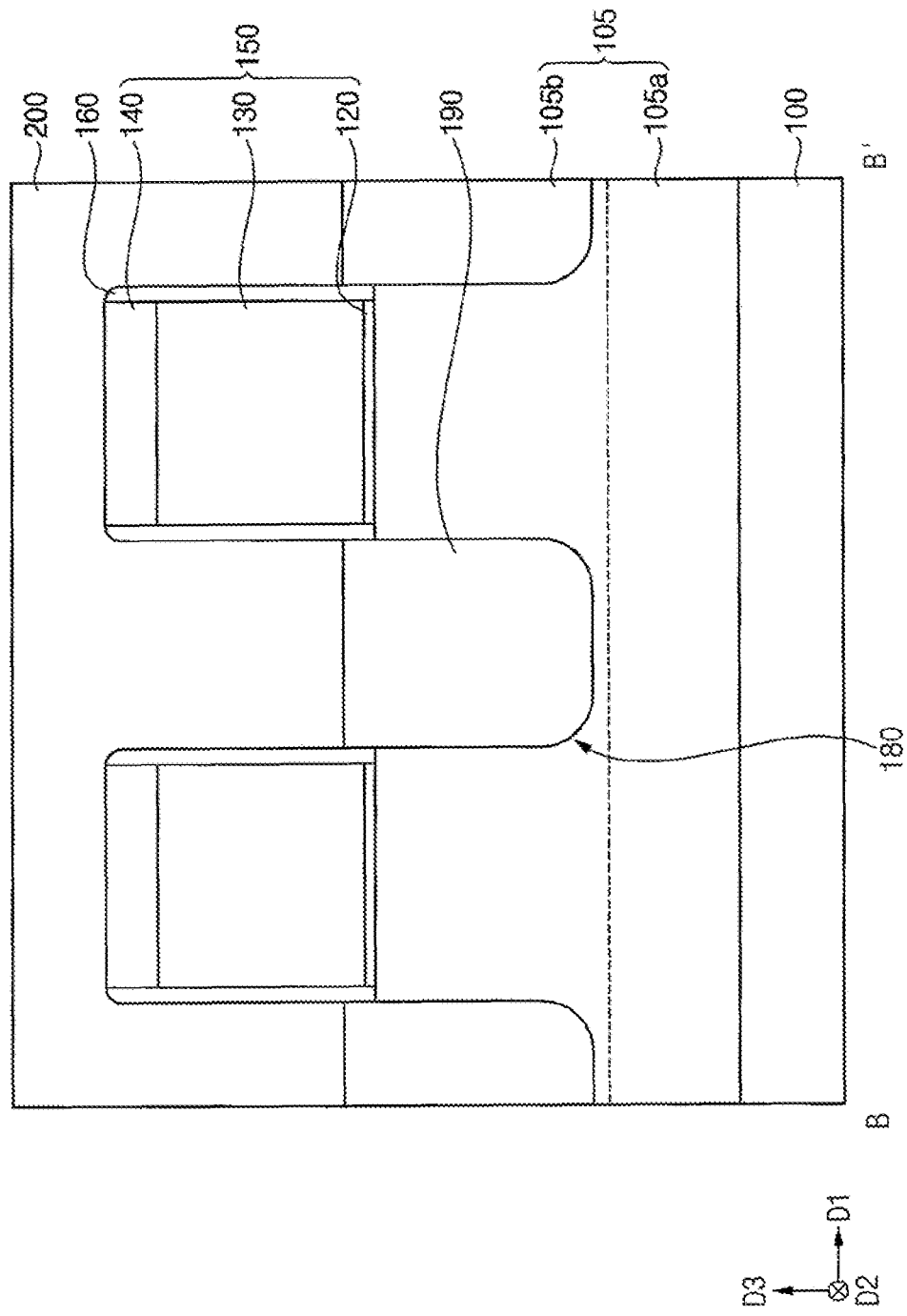
Figure 6:
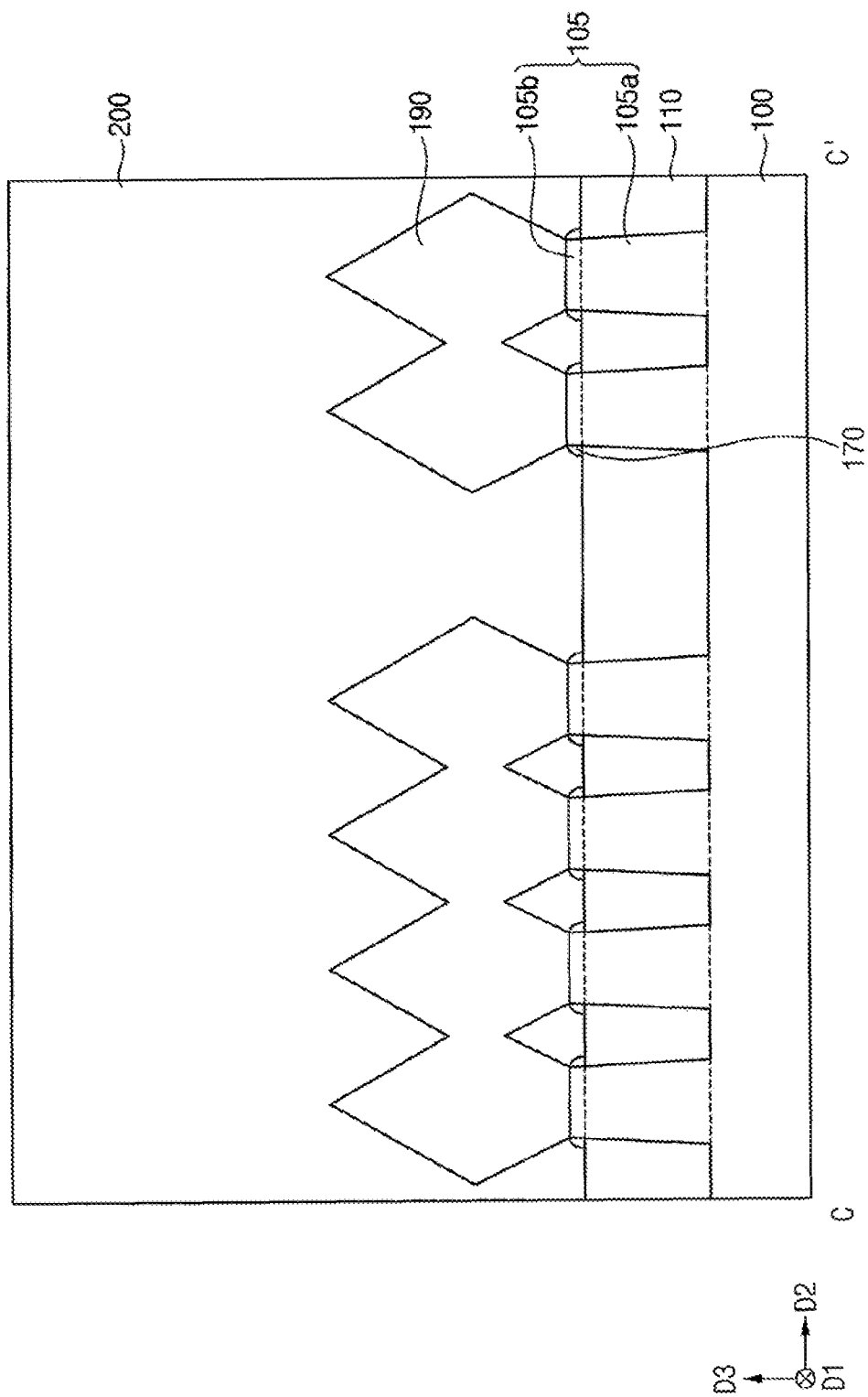
Figure 30:
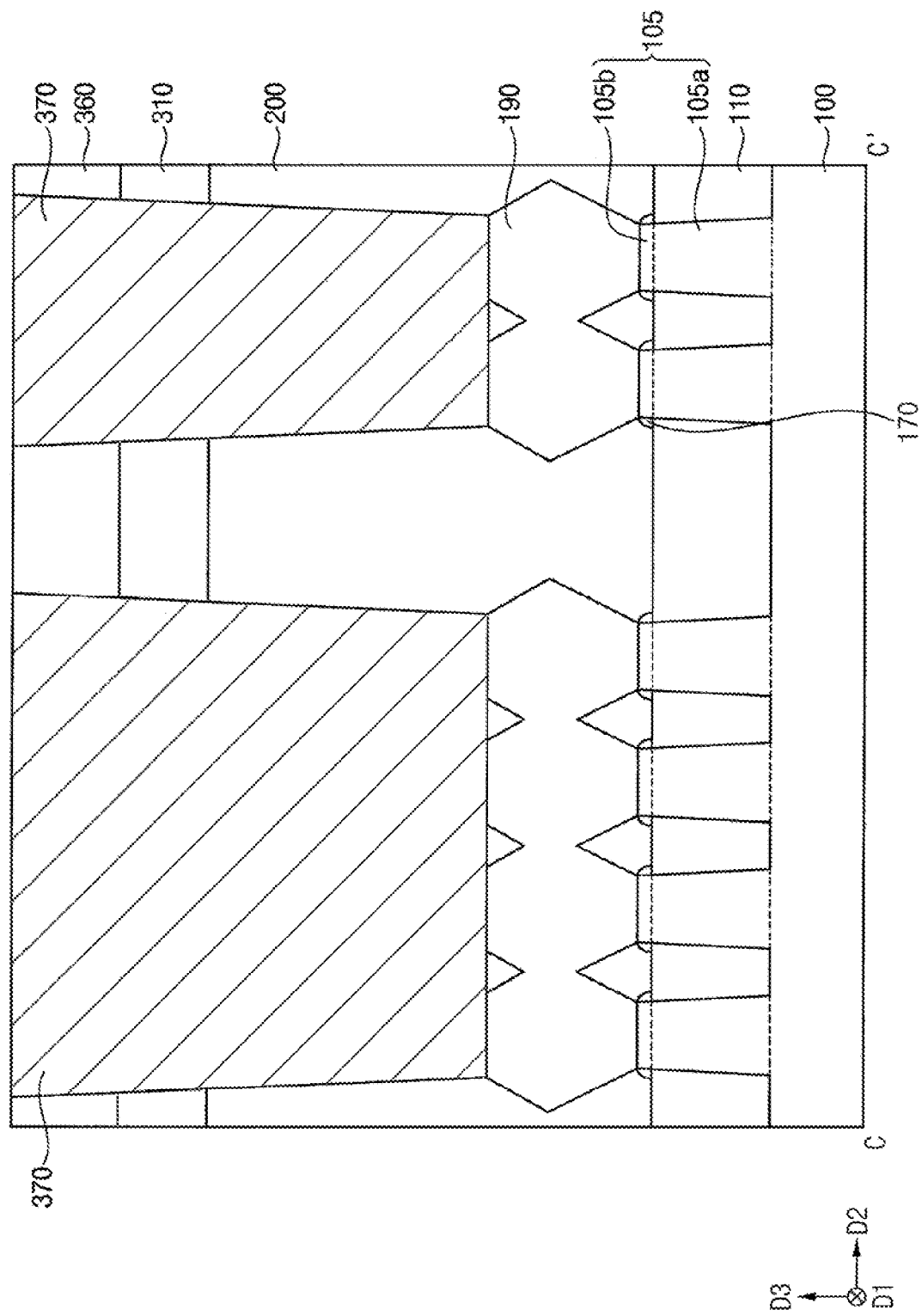
Figure 31:
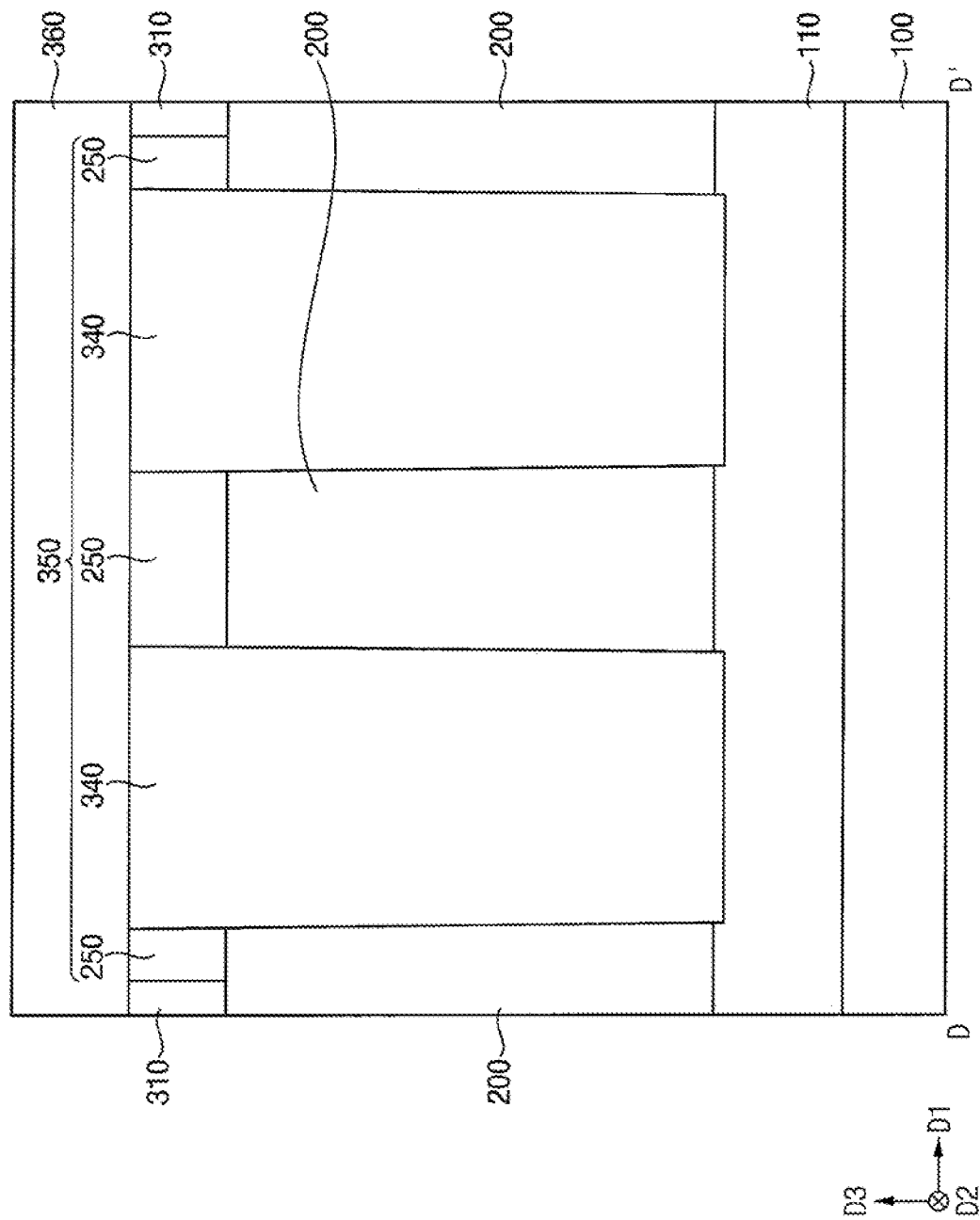

FIGS. 2, 8-9, 11, 14, 17, 20, 22, 25 and 28 are cross-sectional views taken along lines A-A' of the corresponding plan views, respectively, FIGS. 3, 5, 15, 18 and 29 are cross-sectional views taken along lines B-B' of the corresponding plan views, respectively, FIGS. 6 and 30 are cross-sectional views taken along lines C-C' of the corresponding plan views, respectively, and FIGS. 12, 19, 21, 23, 26 and 31 are cross-sectional views taken along lines D-D' of the corresponding plan views, respectively.

Hereinafter in the specification, but not necessarily in the claims, two directions substantially parallel to an upper surface of a substrate and that cross each other may be referred to as first and second directions D1 and D2, respectively, and a direction substantially perpendicular to the upper surface of the substrate may be referred to as a third direction D3. In embodiments, the first and second directions D1 and D2 are substantially perpendicular to each other.

Figure 1:
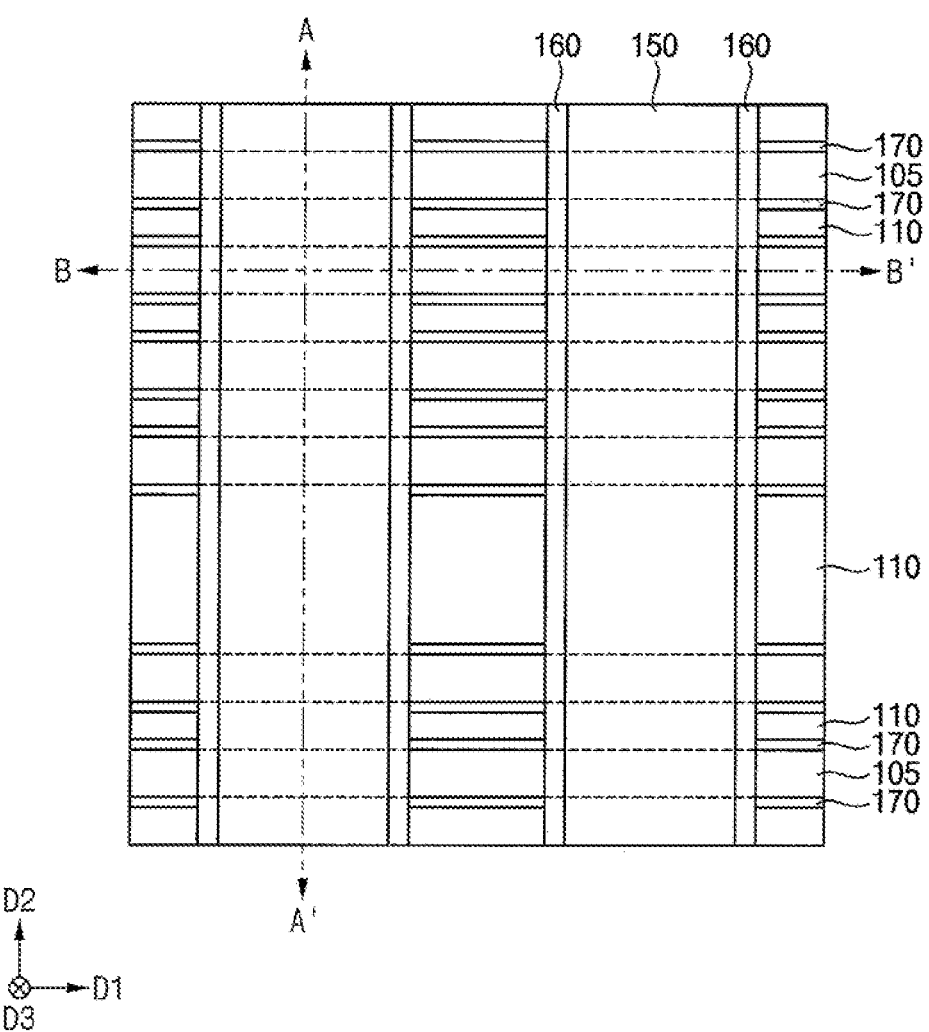
FIGS. 1 to 31 are plan views and cross-sectional views that illustrate a method of manufacturing a semiconductor device in accordance with embodiments.
Figure 2:
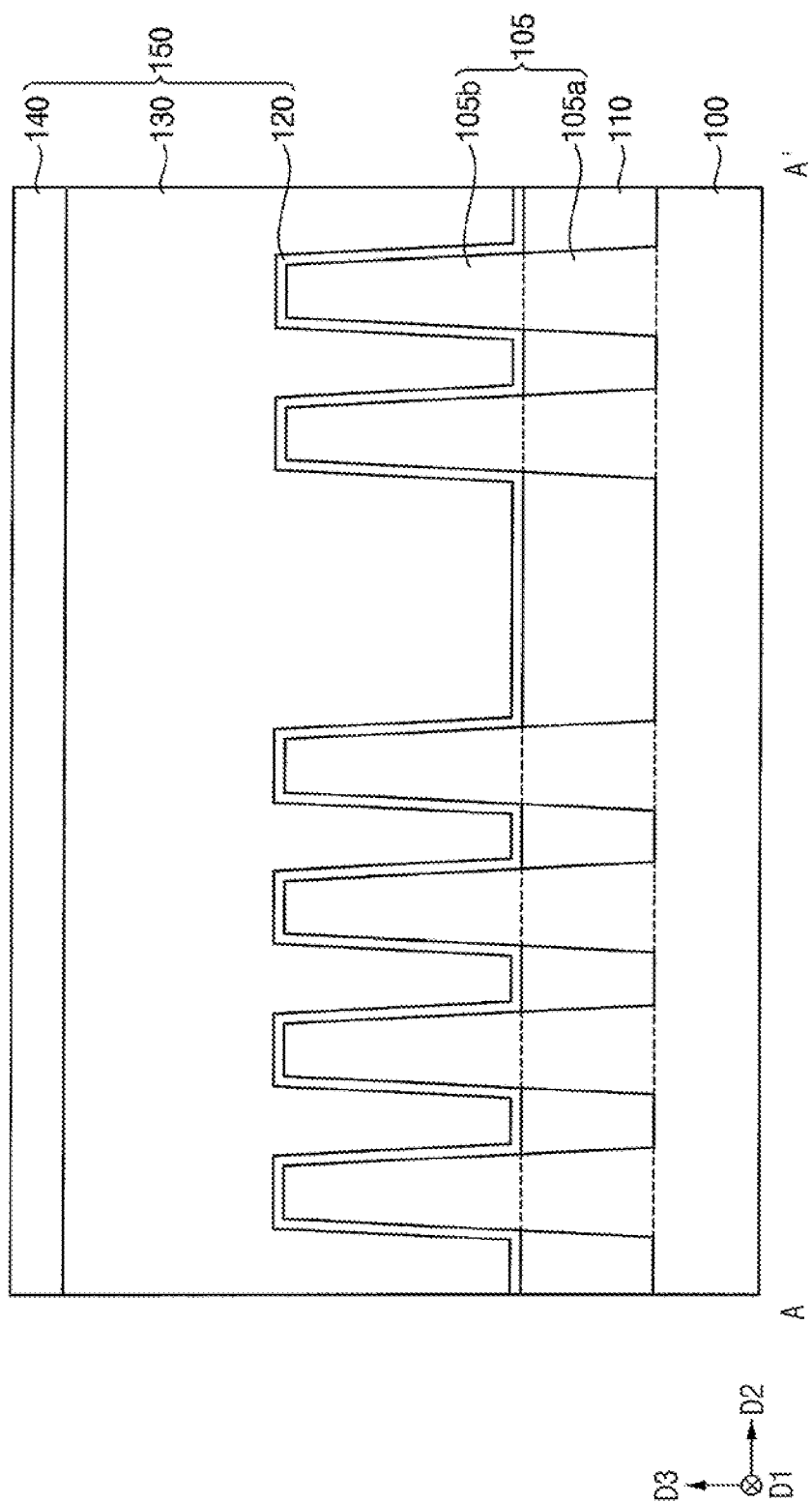
Figure 3:
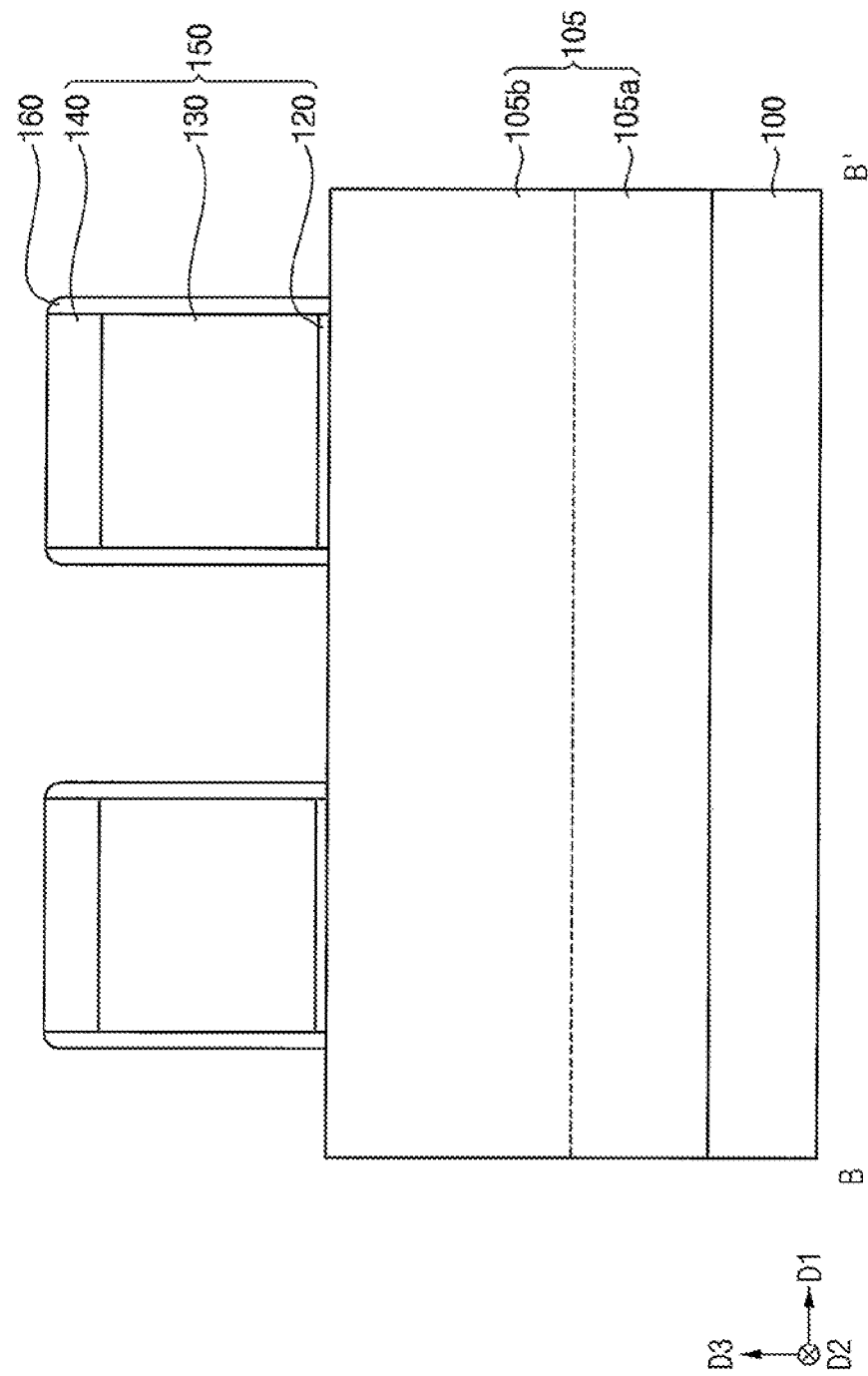

Referring to FIGS. 1 to 3, in some embodiments, an upper portion of a substrate 100 is partially etched to form a trench, and an isolation pattern 110 is formed that fills a lower portion of the trench.

The substrate 100 includes a semiconductor material, such as silicon, germanium, silicon-germanium, etc., or III-V semiconductor compounds, such as GaP, GaAs, GaSb, etc. In some embodiments, the substrate 100 includes a silicon-on-insulator (SOI) substrate or a germanium-on-insulator (GOI) substrate.

In embodiments, the isolation pattern 110 is formed by forming an isolation layer on the substrate 100 that fills the trench, planarizing the isolation layer until an upper surface of the substrate 100 is exposed, and removing an upper portion of the isolation layer to expose an upper portion of the trench. The isolation layer includes an oxide, e.g., silicon oxide.

In some embodiments, the isolation pattern 110 defines a field region whose upper surface is covered by the isolation pattern 110 and an active region 105 that protrudes upward from the isolation pattern 110 and whose upper surface is not covered by the isolation pattern 110. The active region 105 has a fin shape, and thus may be referred to as an active fin or as an active pattern. Hereinafter, only the field region and a portion of the substrate 100 under the active region 105 will be referred to as the substrate 100.

In some embodiments, the active pattern 105 includes a lower active pattern 105$a$ that has a sidewall covered by the isolation pattern 110 and an upper active pattern 105$b$ that has a sidewall not covered by the isolation pattern 110. In embodiments, the active pattern 105 extends in the first direction D1, and a plurality of active patterns 105 are spaced apart from each other in the second direction D2.

In some embodiments, a dummy gate structure 150 is formed on the substrate 100. The dummy gate structure 150 includes a dummy gate insulation pattern 120, a dummy gate electrode 130 and a dummy gate mask 140 that are sequentially stacked.

In some embodiments, the dummy gate insulation pattern 120 includes an oxide, such as silicon oxide, the dummy gate electrode 130 includes, e.g., polysilicon, and the dummy gate mask 140 includes a nitride, such as silicon nitride. The dummy gate insulation pattern 120 has a relatively small thickness as compared with the dummy gate electrode 130 and the dummy gate mask 140.

In some embodiments, the dummy gate structure 150 extends in the second direction D2, and a plurality of dummy gate structures 150 are spaced apart from each other in the first direction D1.

In some embodiments, a gate spacer 160 that extends in the first direction D1 is formed on a sidewall of the dummy gate structure 150, and a fin spacer 170 that extends in the second direction D2 is formed on a sidewall of the active pattern 105.

In some embodiments, the gate spacer 160 and the fin spacer 170 are formed by forming a spacer layer on the substrate 100 and anisotropically etching the spacer layer. The spacer layer includes a nitride, such as silicon nitride or silicon oxycarbonitride, etc.

Figure 4:
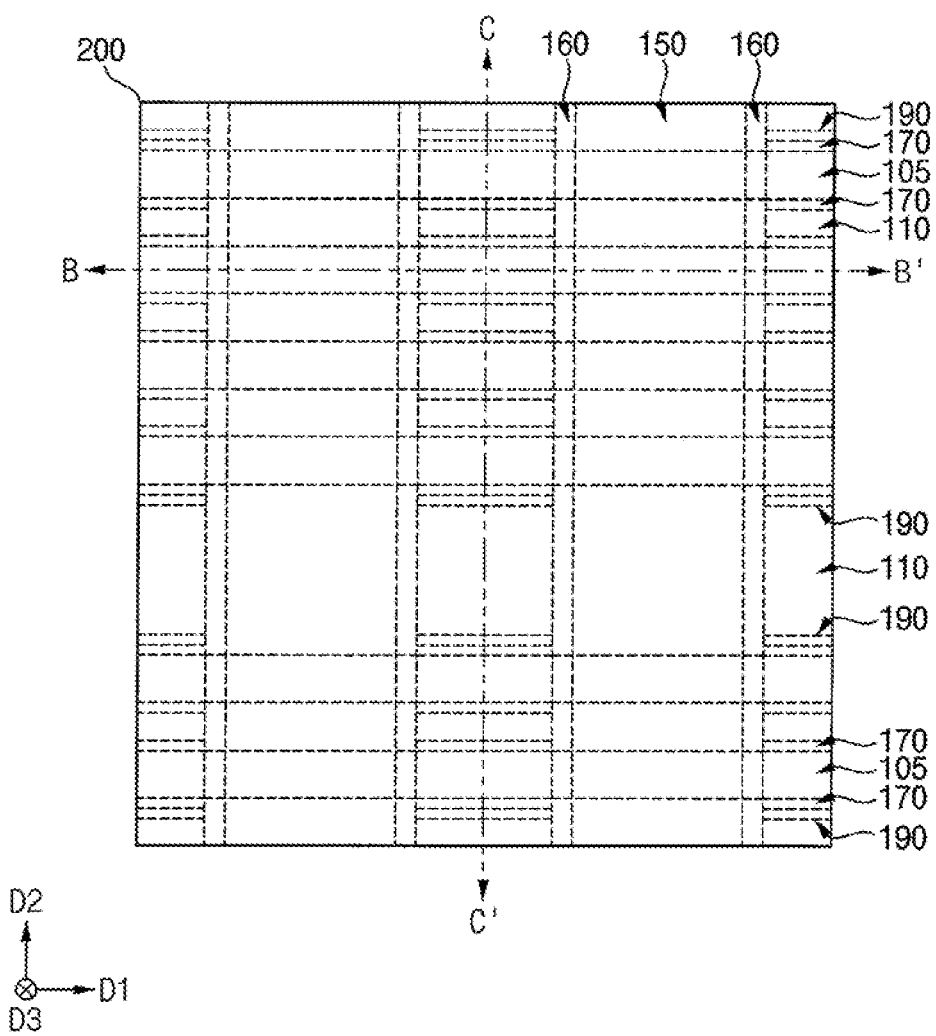

Referring to FIGS. 4 to 6, in some embodiments, an upper portion of the active pattern 105 is etched using the dummy gate structure 150 and the gate spacer 160 as an etching mask to form a first recess 180.

FIG. 5 shows that the first recess 180 is formed by removing only a portion of the upper active pattern 105b, however, embodiments of the inventive concept are not limited thereto, and in other embodiments, the first recess 180 can be formed by removing the portion of the upper active pattern 105b together with a portion of the lower active pattern 105a.

In some embodiments, the etching process that forms the first recess 180 and the anisotropical etching process on the spacer layer can be performed in-situ.

In some embodiments, a selective epitaxial growth (SEG) process is performed on the upper surface of the active pattern 105 exposed by the first recess 180 to form a source/drain layer 190 on the active pattern 105.

In some embodiments, the SEG process is performed using a source gas, such as dichlorosilane ($SiH_2Cl_2$) gas, germane ($GeH_4$) gas, etc., and thus a single crystalline silicon-germanium layer is formed. A p-type impurity source gas, such as diborane ($B_2H_6$) gas, is also used so that a single crystalline silicon-germanium layer doped with p-type impurities is formed. Thus, the source/drain layer 190 can serve as a source/drain region of a PMOS transistor.

In other embodiments, the SEG process is performed using a source gas, such as disilane ($Si_2H_6$) gas, $SiH_3CH_3$ gas, etc., and thus a single crystalline silicon carbide layer is formed. An n-type impurity source gas, such as phosphine ($PH_3$) gas, is also used so that a single crystalline silicon carbide layer doped with n-type impurities is formed. Thus, the source/drain layer 190 can serve as a source/drain region of an NMOS transistor. Alternatively, in still other embodiments, the SEG process is performed using a source gas, such as disilane ($Si_2H_6$) gas, and the n-type impurity source gas, such as phosphine ($PH_3$) gas, so that a single crystalline silicon layer doped with n-type impurities is formed. Thus, the source/drain layer 190 can serve as a source/drain region of an NMOS transistor.

In some embodiments, the source/drain layer 190 fills the first recess 180, and contacts a lower sidewall of the gate spacer 160. The source/drain layer 190 is grown not only in the vertical direction but also in the horizontal direction, and a cross-section of the source/drain layer 190 taken along the second direction D2 has a pentagon-like shape. When a distance in the second direction D2 between neighboring active patterns 105 is small, the source/drain layers 190 on the active patterns 105 merge with each other.

In some embodiments, a first insulating interlayer 200 is formed on the substrate 100. The first insulating interlayer 200 includes an oxide, such as silicon oxide.

Figure 7:
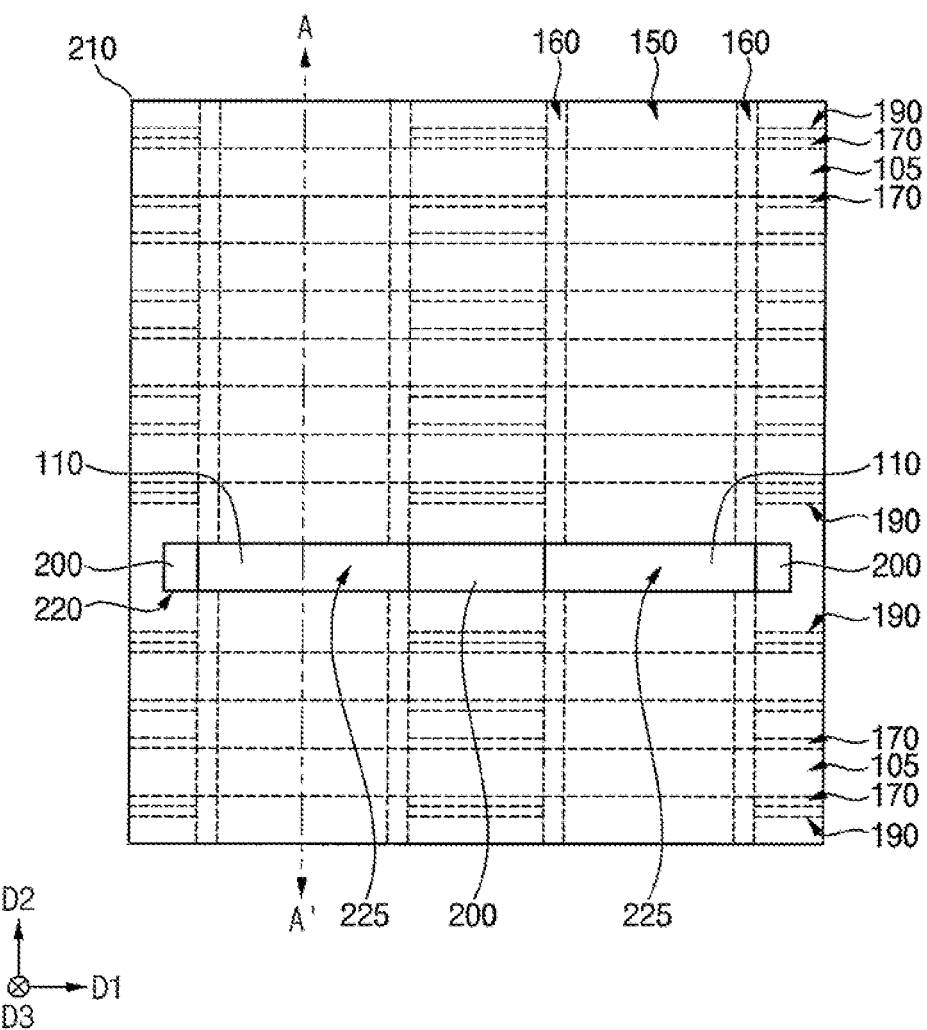
Figure 8:
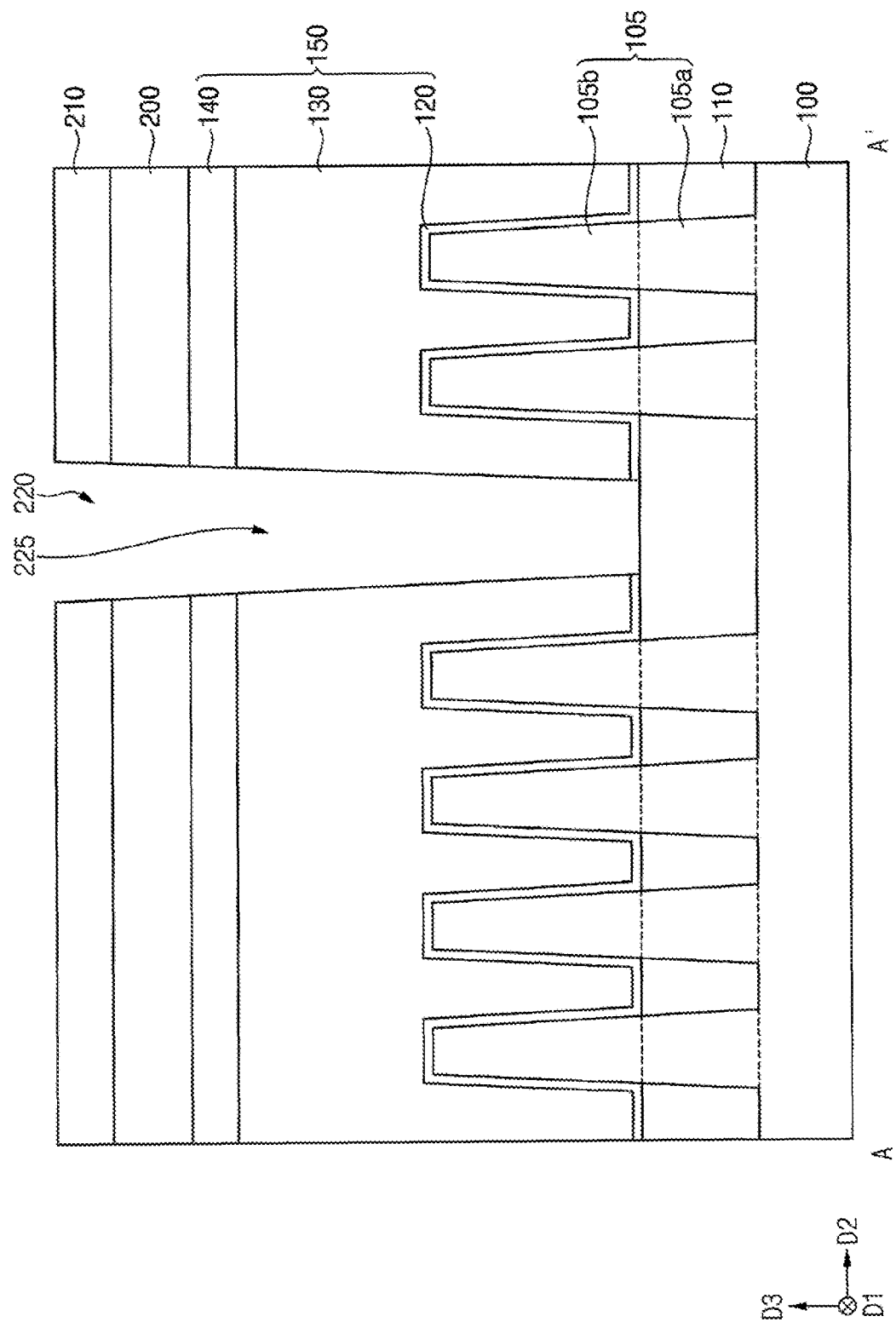

Referring to FIGS. 7 and 8, in some embodiments, a first etching mask 210 that has a first opening 220 is formed on the first insulating interlayer 200, and a dry etching process is performed to partially etch the first insulating interlayer 200 and the dummy gate structure 150 that divides the dummy gate structure 150 that into parts that are spaced apart from each other in the second direction D2.

In some embodiments, the first etching mask 210 is formed by forming a first etching mask layer on the first insulating interlayer 200, and performing an etching process using a photoresist pattern as an etching mask. The first etching mask 210 includes, e.g., tetraethyl orthosilicate (TEOS).

In some embodiments, the first opening 220 extends in the first direction D1, and partially overlaps the dummy gate structure 150, the gate spacer 160 and the isolation pattern 110 in the third direction D3. FIG. 7 shows that the first opening 220 overlaps in the third direction D3 two dummy gate structures 150 that are adjacent in the first direction D1, however, embodiments of the inventive concept are not limited thereto, and in other embodiments, the first opening 220 overlaps one or more than two dummy gate structures 150.

During a dry etching process, in some embodiments, a portion of the first insulating interlayer 200 exposed by the first opening 220 is removed, and then the dummy gate mask 140, the gate spacer 160 and the dummy gate electrode 130 that overlap the first opening 220 in the third direction D3 are partially removed. The dummy gate insulation pattern 120 may be partially removed or may remain during the dry etching process.

Thus, in some embodiments, a second opening 225 that extends through an upper portion of the first insulating interlayer 200, the dummy gate structure 150 and the gate spacer 160 is formed that exposes an upper surface of the isolation pattern 110, and the first insulating interlayer 200 remains in areas where the dummy gate structure 150 and the gate spacer 160 are not formed. The second opening 225 may be considered to be an extension or continuation of the first opening 220, so the first and second openings 220, 225 form a single opening that penetrates the first etching mask 210, the first insulating interlayer 200, the dummy gate structure 150, the gate spacer 160, and extends to the isolation pattern 110. However, the portion of the first insulating interlayer 200 that overlaps the first opening 220 in the third direction D3 is partially removed by the dry etching process, and thus an upper surface of the portion of the first insulating interlayer 200 has a height that is lower than that of other portions of the first insulating interlayer 200. After the dry etching process, the upper surface of the portion of the first insulating interlayer 200 that overlaps the first opening 220 has a height that is equal or similar to that of an upper surface of the dummy gate structure 150.

Figure 9:
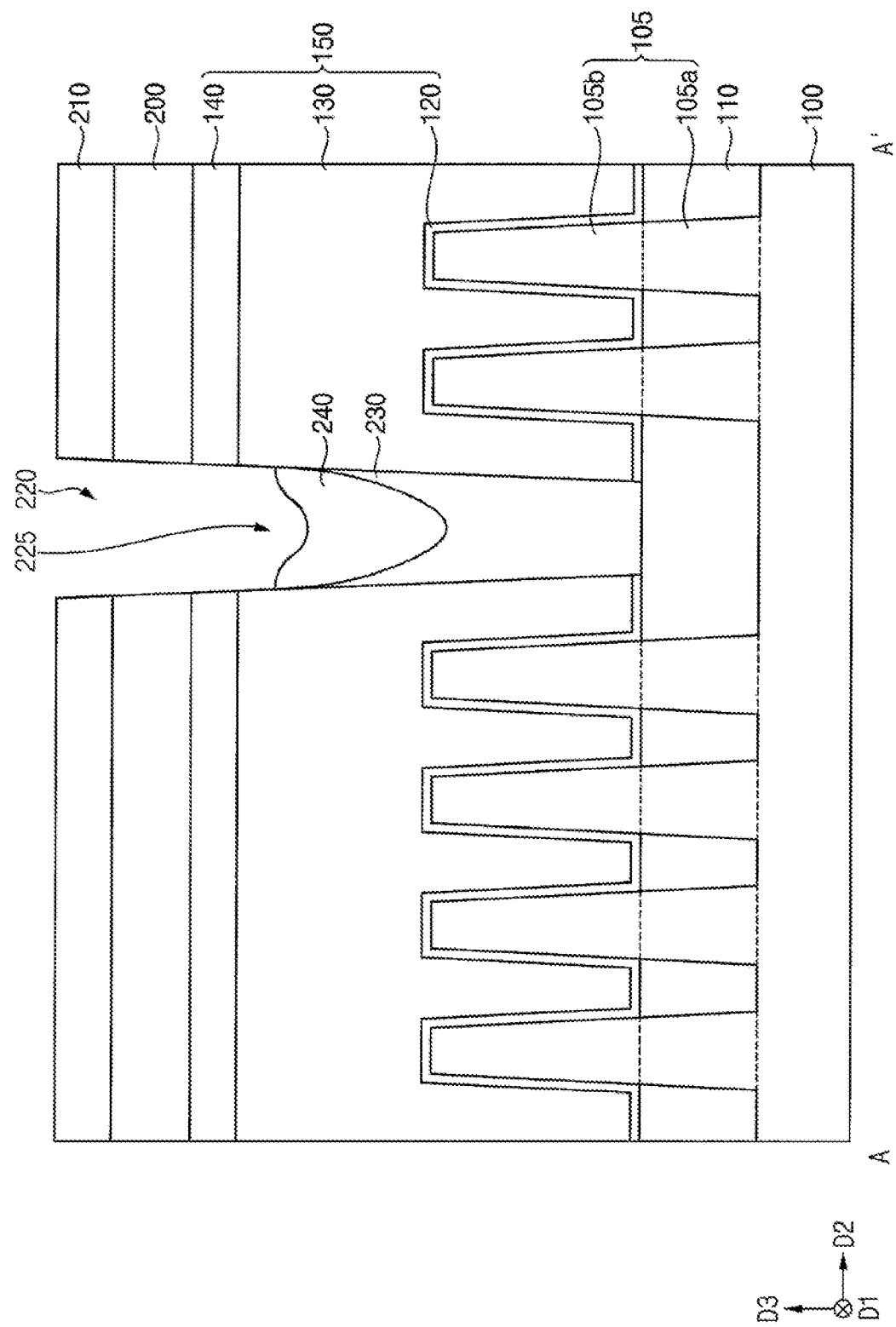

Referring to FIG. 9, in some embodiments, a first insulation layer is formed on the isolation pattern 110 and the first insulating interlayer 200 that fills the first and second openings 220 and 225, and, for example, an etch back process is performed on the first insulation layer to form a first insulation pattern 230 in a lower portion of the second opening 225.

In some embodiments, the first insulation layer does not entirely fill the second opening 225, and thus a void or seam is formed in the first insulation layer. Thus, an upper surface of the first insulation pattern 230 that is formed by partially etching the first insulation layer has a concave shape.

In some embodiments, a second insulation layer is formed on the first insulation pattern 230 and the first insulating interlayer 200 that fills the first and second openings 220 and 225, and, for example, an etch back process is performed on the second insulation layer to form a second insulation pattern 240 in a middle portion of the second opening 225. An upper surface of the second insulation pattern 240 also has a concave shape. In some embodiments, the second insulation layer is formed by an atomic layer deposition (ALD) process.

In some embodiments, each of the first and second insulation patterns 230 and 240 includes a nitride, such as silicon nitride.

Figure 10:
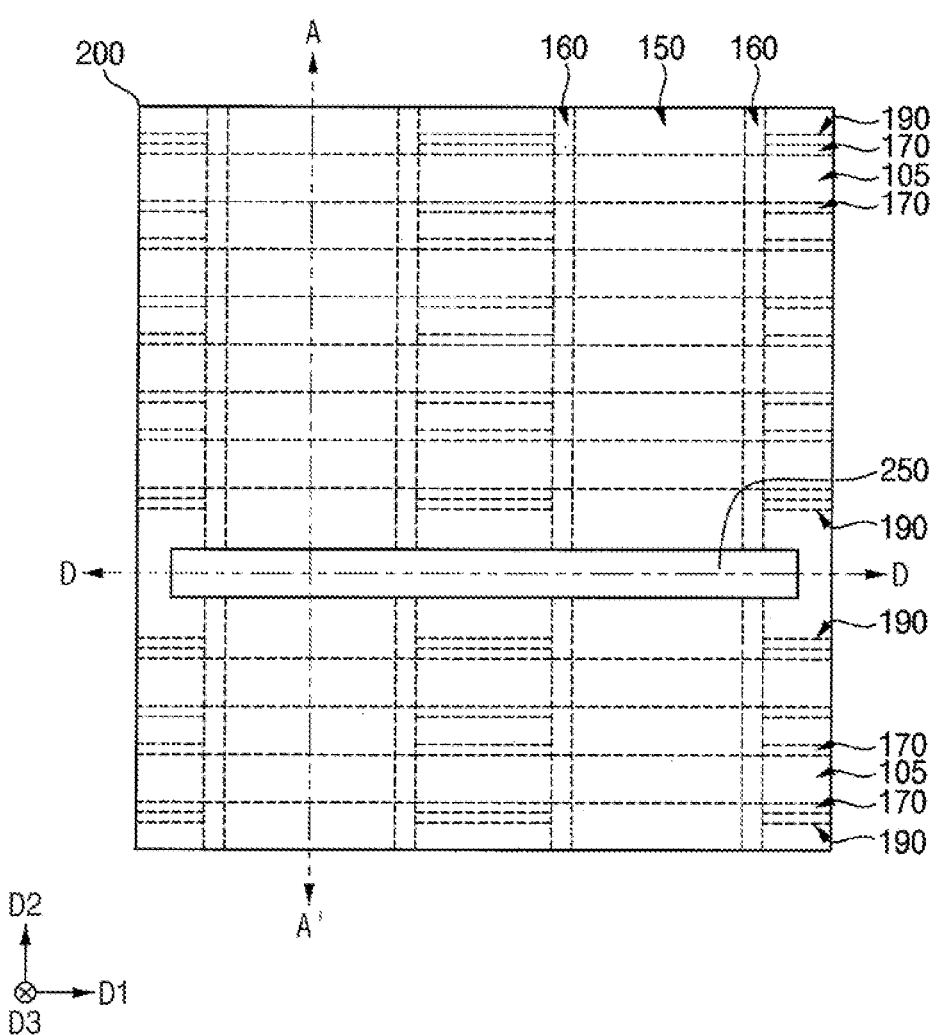
Figure 11:
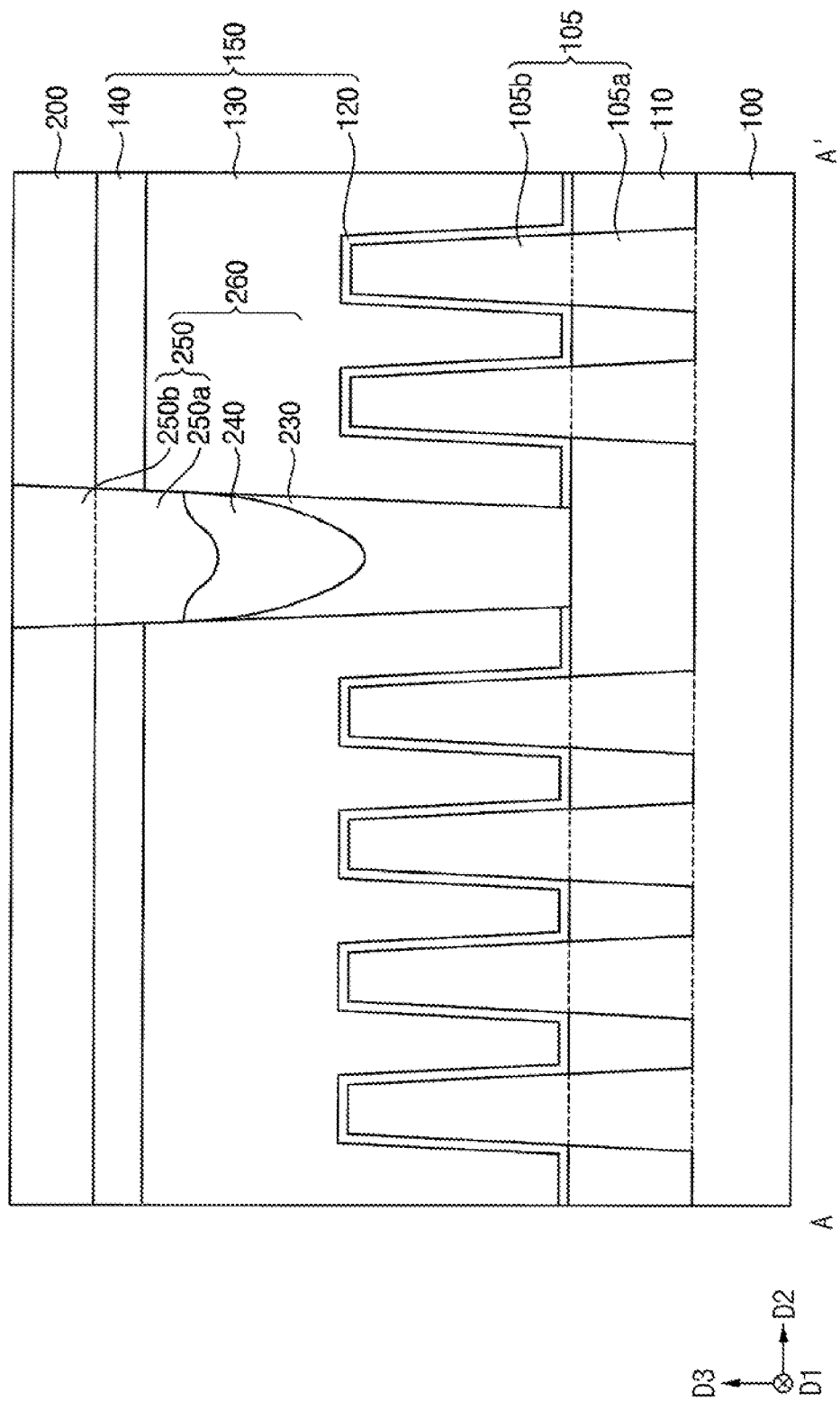
Figure 12:
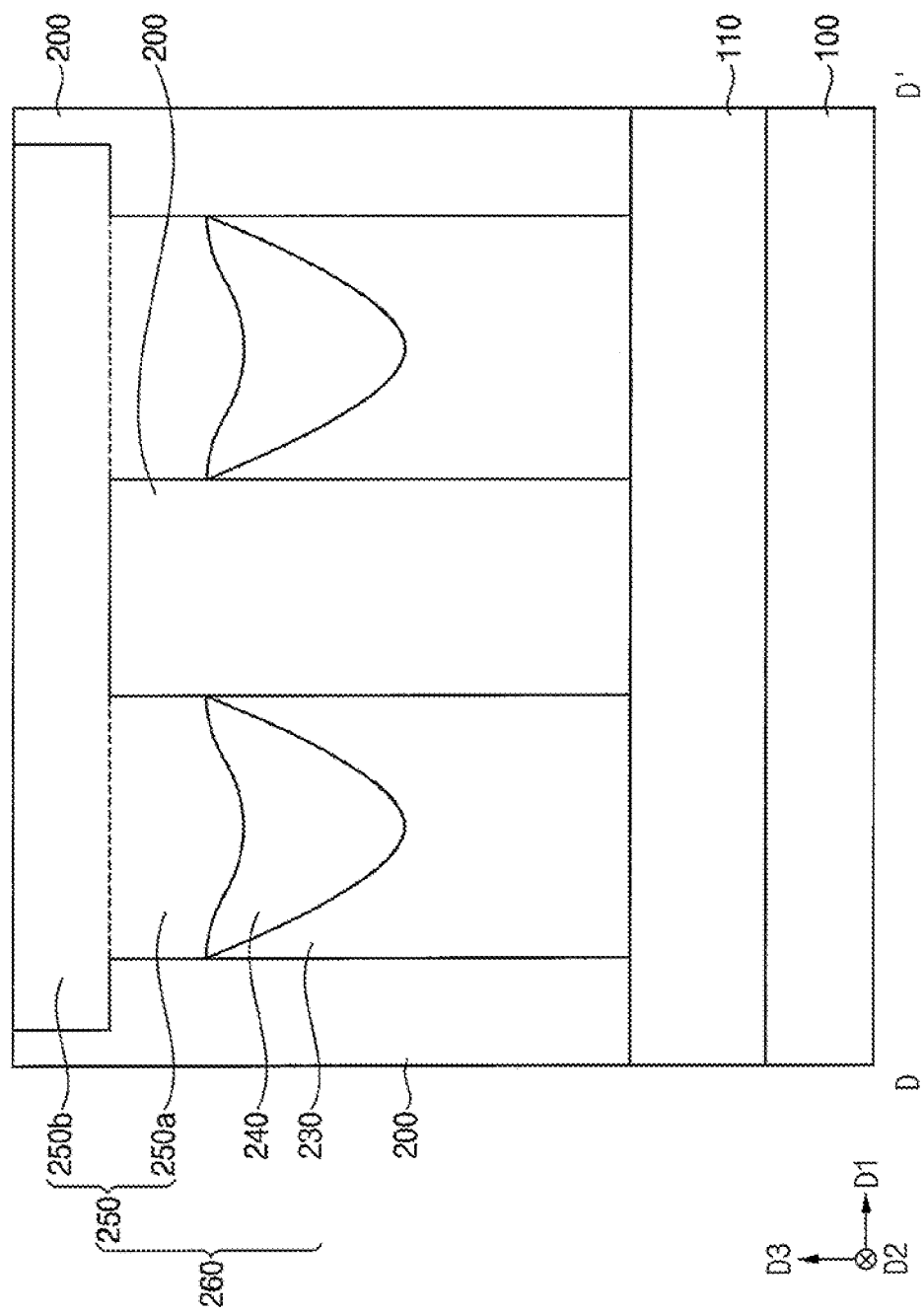

Referring to FIGS. 10 to 12, in some embodiments, a third insulation layer is formed on the second insulation pattern 240 and the first insulating interlayer 200 that fills the first and second openings 220 and 225, and, for example, a planarization process is performed on the third insulation layer to form a third insulation pattern 250 at an upper portion of the second opening 225.

In some embodiments, the planarization process is performed by, e.g., a chemical vapor deposition (CVD) process, which is performed until an upper surface of the first insulating interlayer 200 is exposed. Thus, during the planarization process, the first etching mask 210 is removed, and the third insulation pattern 250 fills not only the upper portion of the second opening 225 but also a space formed by removing an upper portion of the first insulating interlayer 200 during the formation of the second opening 225. That is, the third insulation pattern 250 may include a vertical extension portion 250a that fills the upper portion of the second opening 225 and a horizontal extension portion 250b that extends in the first direction D1 on the vertical extension portion 250a. Although the drawings show two vertical extension portions 250a that contact a lower surface of one horizontal extension portion 250b and that are spaced apart from each other in the first direction D1, embodiments of the inventive concept are not limited thereto.

In some embodiments, an upper surface of the third insulation pattern 250 is flat, and the third insulation pattern 250 includes a nitride, such as tonen silazene (TOSZ).

In some embodiments, the first to third insulation patterns 230, 240 and 250 form a first division pattern structure 260. The first division pattern structure 260 includes materials that differ from that of the first insulating interlayer 200.

Figure 13:
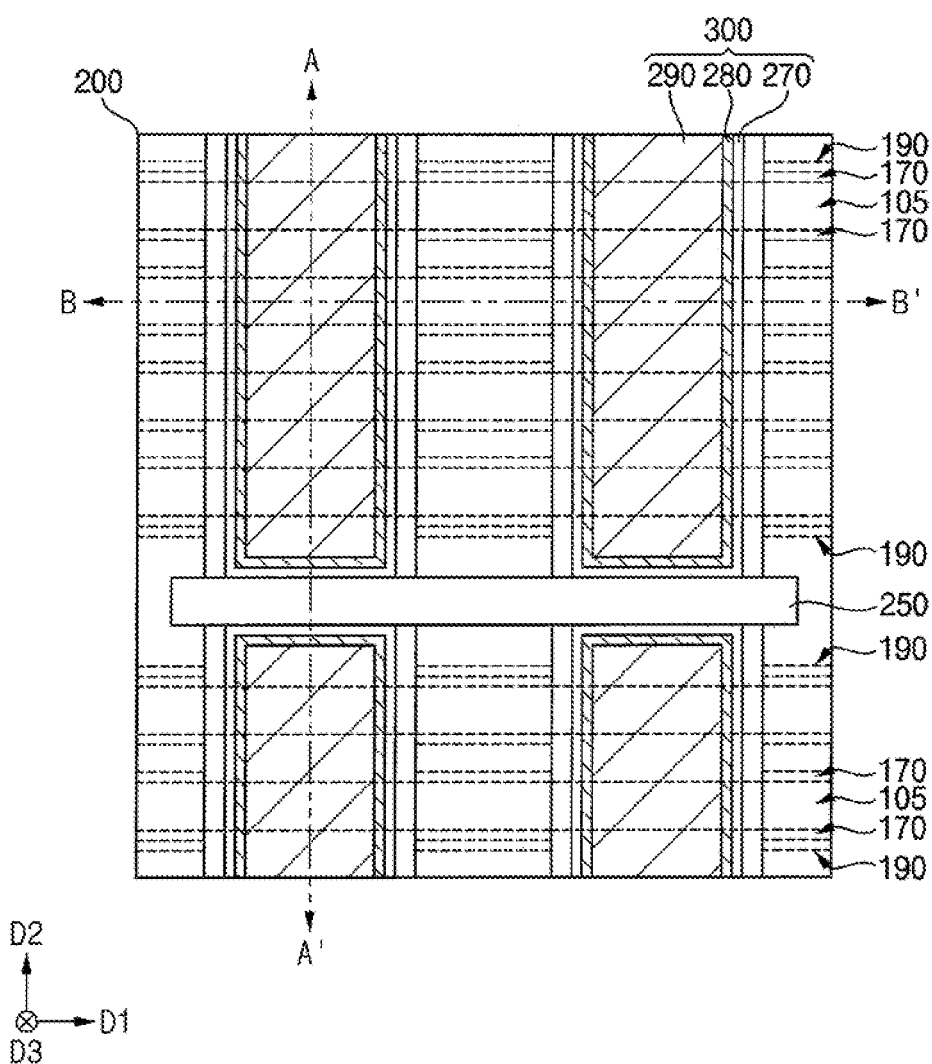
Figure 14:
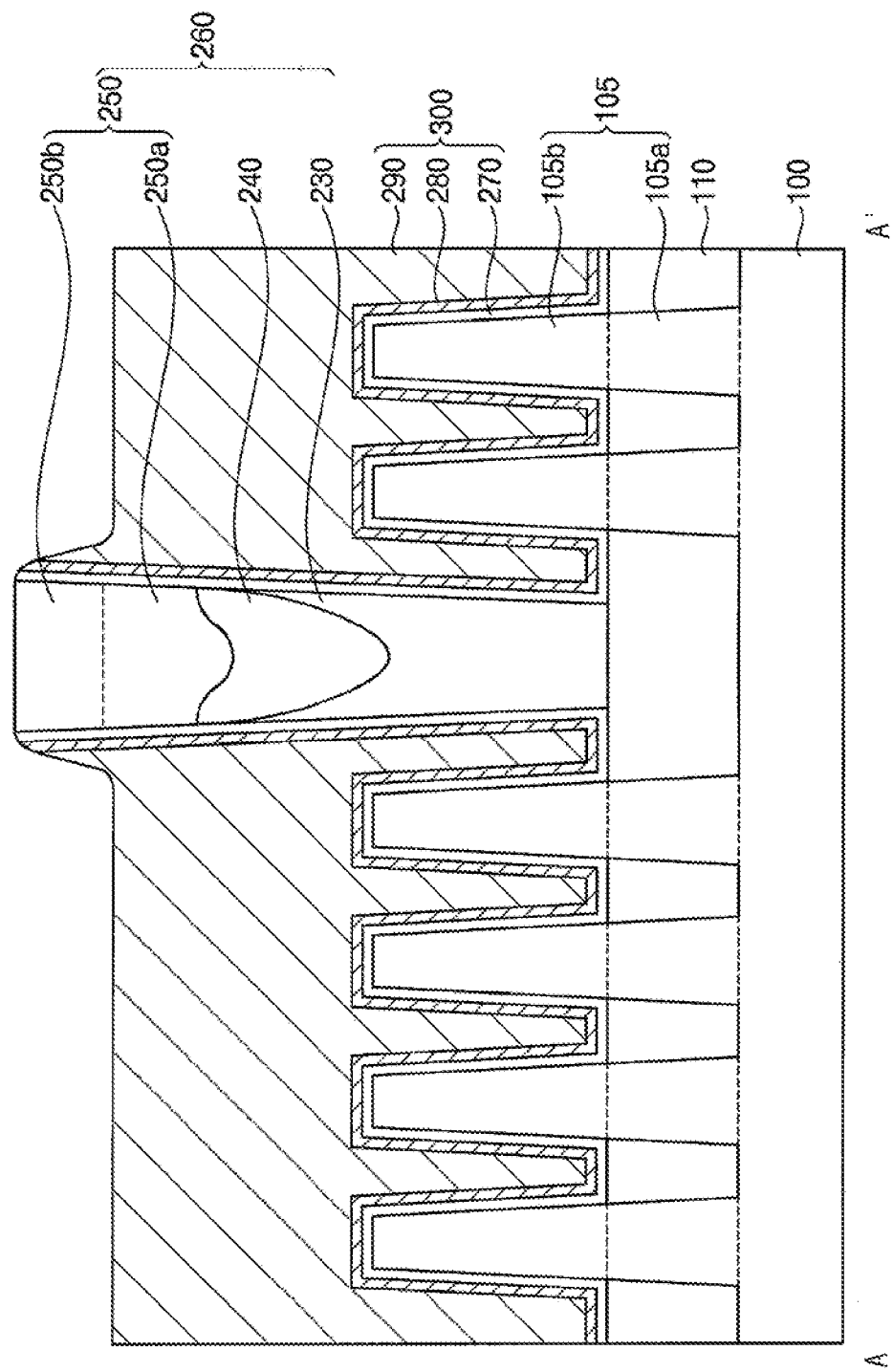
Figure 15:
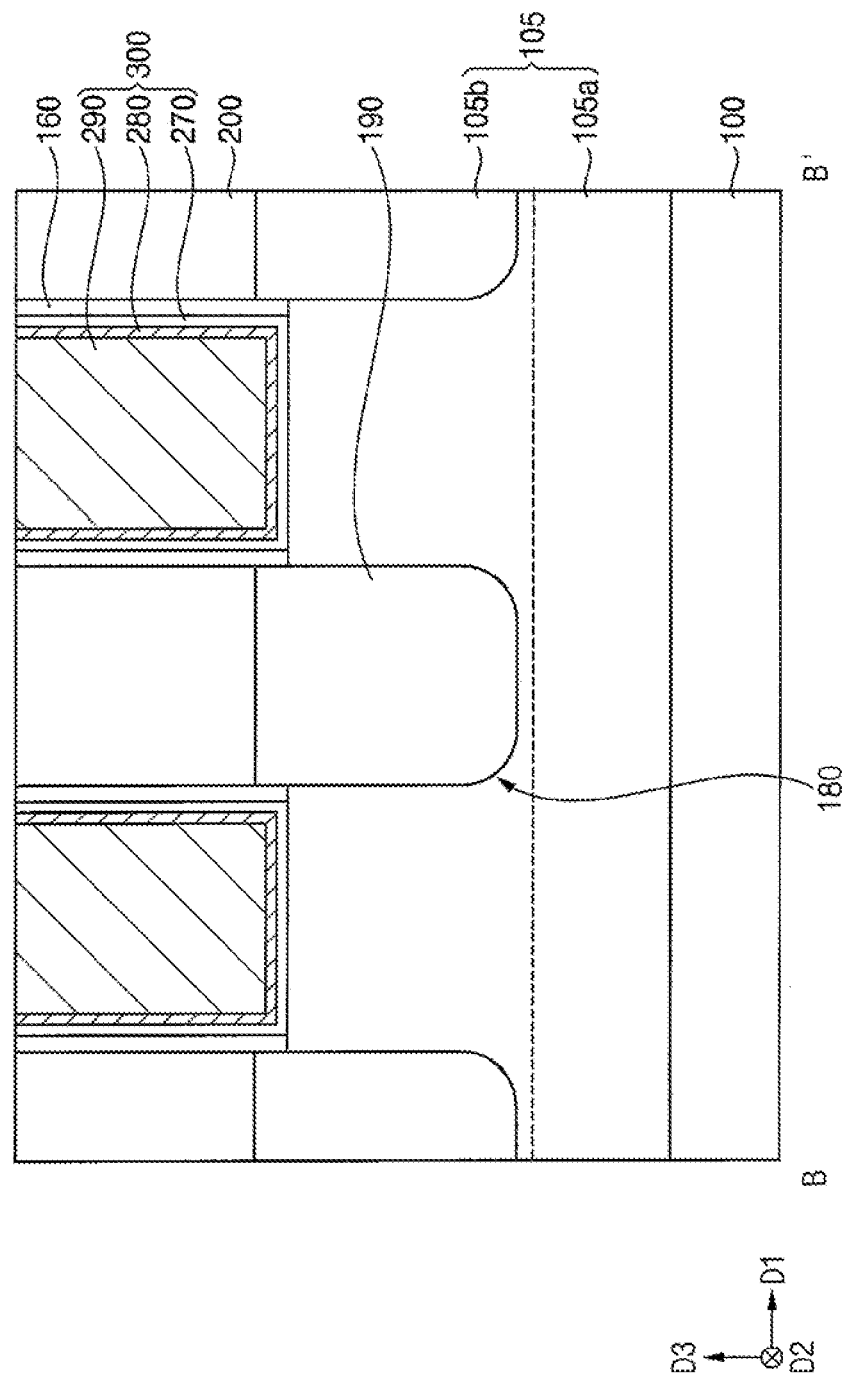
Figure 16:
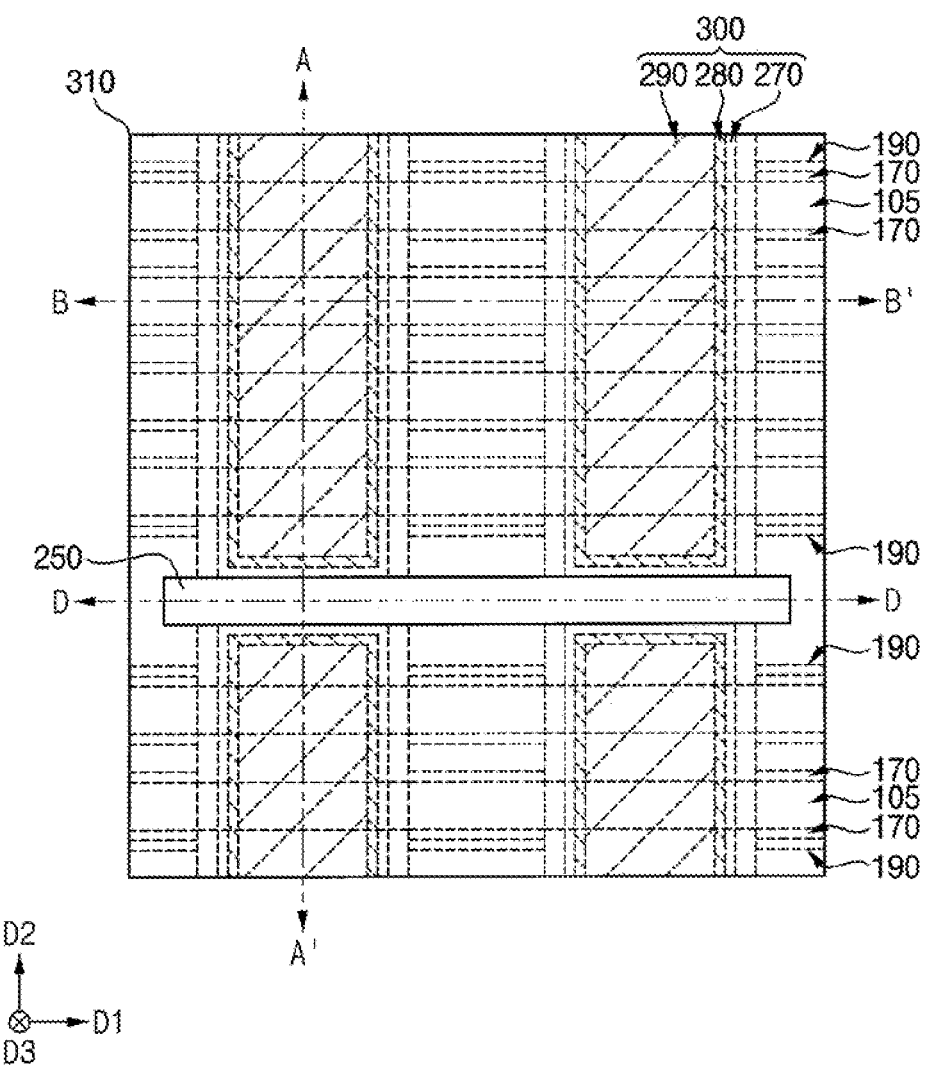
Figure 17:
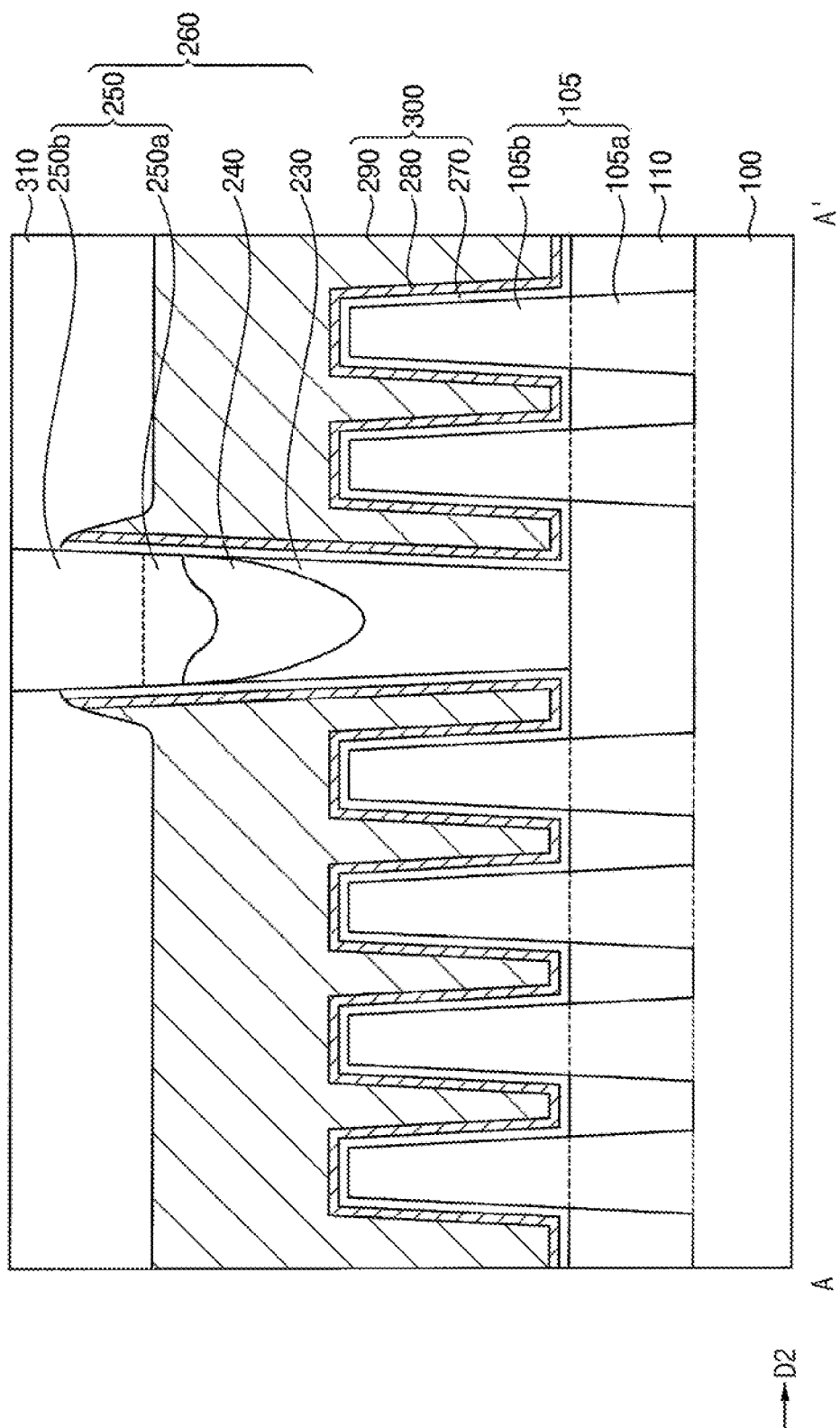
Figure 18:
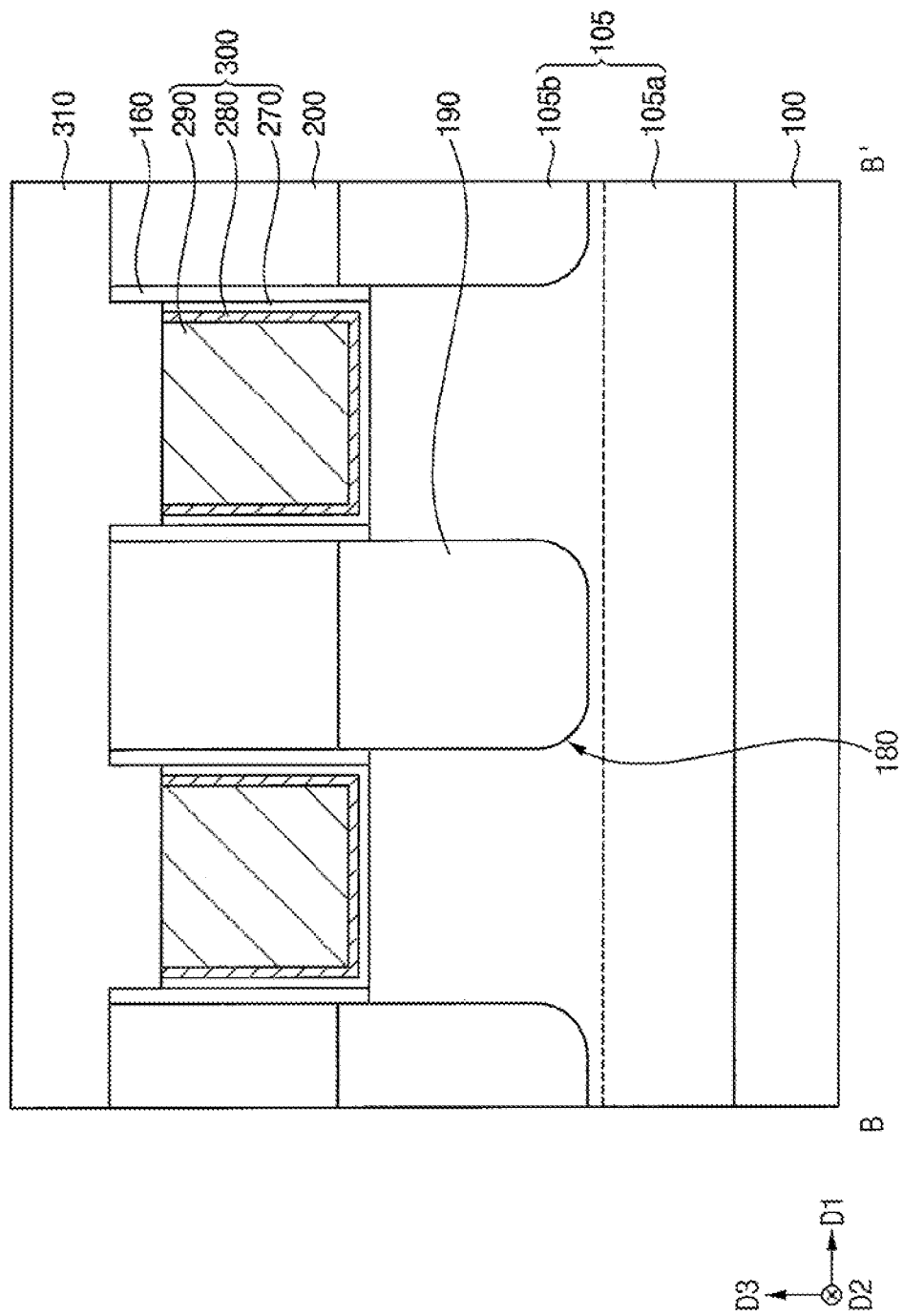
Figure 19:
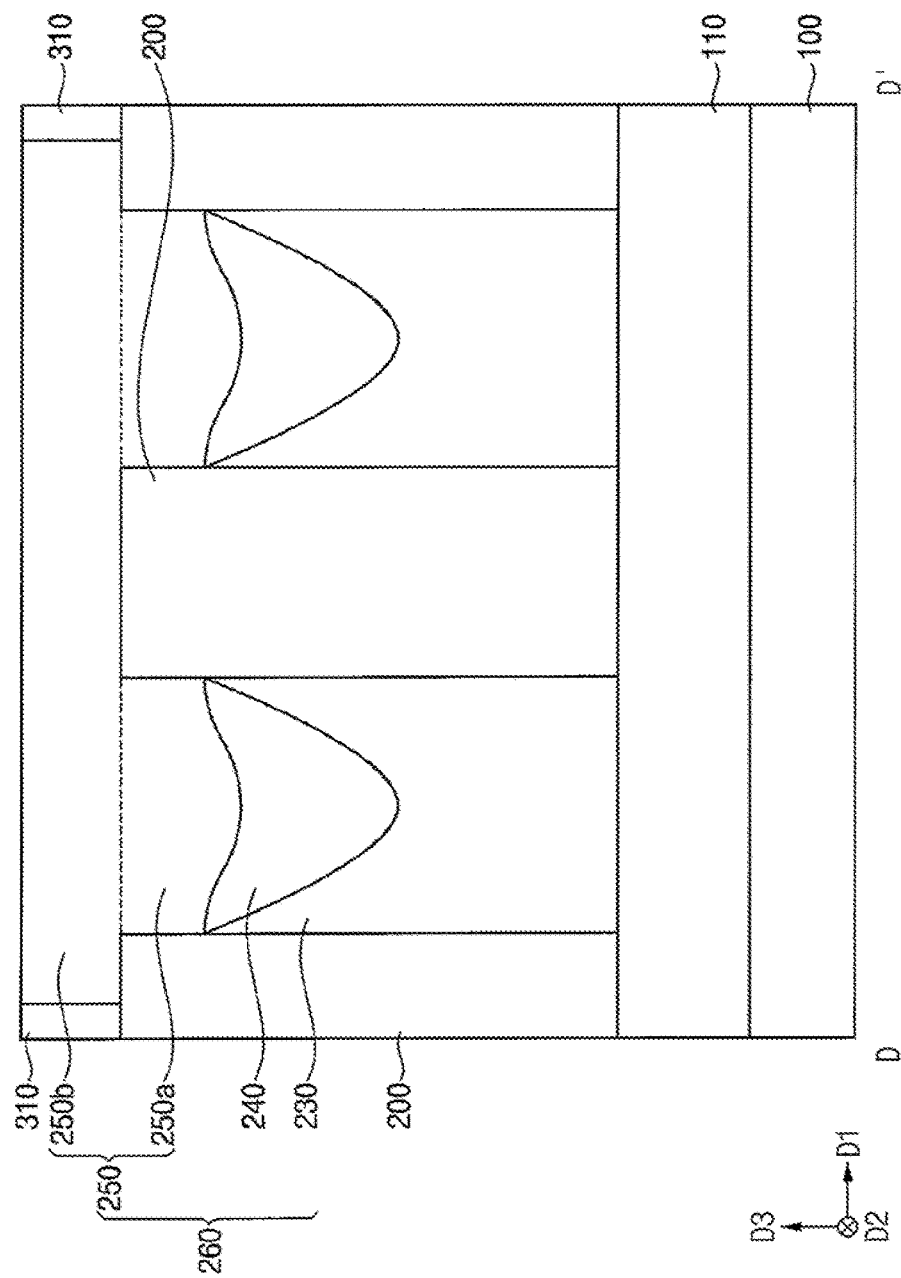

Referring to FIGS. 13 to 15, in some embodiments, an upper portion of the first insulating interlayer 200 is removed by a planarization process, and thus an upper surface of the dummy gate structure 150 is exposed.

During the planarization process, in some embodiments, an upper portion of the first division pattern structure 260 is not removed, and thus, after the planarization process, an upper surface of the first division pattern structure 260 is higher than that of an upper surface of the first insulating interlayer 200. That is, the first division pattern structure 260 protrudes upward from the upper surface of the first insulating interlayer 200.

In some embodiments, the dummy gate mask 140, the dummy gate electrode 130 and the dummy gate insulation pattern 120 in the exposed dummy gate structure 150 are removed to form a third opening that exposing upper surfaces of the active pattern 105 and the isolation pattern 110.

In some embodiments, the dummy gate structure 150 is removed by sequentially performing a dry etching process and a wet etching process. The wet etching process can be performed using, e.g., hydrofluoric acid as an etching solution.

In some embodiments, a gate structure 300 is formed that fills the third opening.

In particular, in some embodiments, a thermal oxidation process is performed on the upper surface of the active pattern 105 exposed by the third opening to form an interface pattern. Then, a gate insulation layer and a gate barrier layer is sequentially formed on an upper surface of the interface pattern, the upper surface of the isolation pattern 110 exposed by the third opening, a sidewall of the third opening, a sidewall of the first division pattern structure 260, an upper surface of the gate spacer 160 and the upper surface of the first insulating interlayer 200, after which a gate electrode layer is formed on the gate barrier layer to fill a remaining portion of the third opening.

In some embodiments, the gate insulation layer includes a metal oxide that has a high dielectric constant, such as hafnium oxide, tantalum oxide, zirconium oxide, etc. The gate barrier layer includes a metal nitride, such as titanium nitride, titanium aluminum nitride, tantalum nitride, or tantalum aluminum nitride, etc.

In an embodiment, the gate electrode layer includes first and second electrode layers that are sequentially stacked, however, embodiments of the inventive concept are not limited thereto. The first electrode layer includes at least one of a metal alloy, a metal carbide, a metal oxynitride, a metal carbonitride, or a metal oxycarbonitride, such as titanium aluminum, titanium aluminum carbide, titanium aluminum oxynitride, titanium aluminum carbonitride, or titanium aluminum oxycarbonitride, etc., and the second electrode layer includes a low resistance metal, such as tungsten, aluminum, copper, or tantalum, etc.

In some embodiments, the gate electrode layer, the gate barrier layer and the gate insulation layer are planarized until the upper surface of the first insulating interlayer 200 is exposed to form the gate structure 300 in the third opening. The gate structure 300 includes a gate insulation pattern 270, a gate barrier 280 and a gate electrode 290 that are sequentially stacked, and the interface pattern is formed between the active pattern 105 and the gate structure 300. The gate electrode 290 includes the first and second electrodes that are sequentially stacked. The gate insulation pattern 270 includes an insulating material, and the gate barrier 280 and the gate electrode 290 include a metal.

During the planarization process, in some embodiments, very little of an upper portion of the first division pattern structure 260 is removed, and thus upper surfaces of portions of the gate insulation pattern 270, the gate barrier 280 and the gate electrode 290 on an upper sidewall of the first division pattern structure 260 are higher than an upper surface of a portion of the gate electrode 290 that extends away from the sidewall of the first division pattern structure 260. That is, portions of the gate insulation pattern 270, the gate barrier 280 and the gate electrode 290 protrude upward from the upper surface of the gate electrode 290.

Referring to FIGS. 16 to 19, in some embodiments, an upper portion of the gate structure 300 is removed to form a second recess. Then, a capping layer is formed on the first insulating interlayer 200, the gate spacer 160 and the first division pattern structure 260, after which the capping layer is planarized until an upper surface of the first division pattern structure 260 is exposed.

Thus, in some embodiments, a capping pattern 310 is formed on the gate structure 300, the gate spacer 160 and the first insulating interlayer 200. The capping pattern 310 includes a nitride, such as silicon nitride.

During the formation of the second recess, in some embodiments, the portions of the gate insulation pattern 270, the gate barrier 280 and the gate electrode 290 on the upper sidewall of the first division pattern structure 260 are partially removed, however, the upper surfaces thereof still protrude upward from the upper surface of the portion of the gate electrode 290 that extends away from the sidewall of the first division pattern structure 260.

Figure 20:
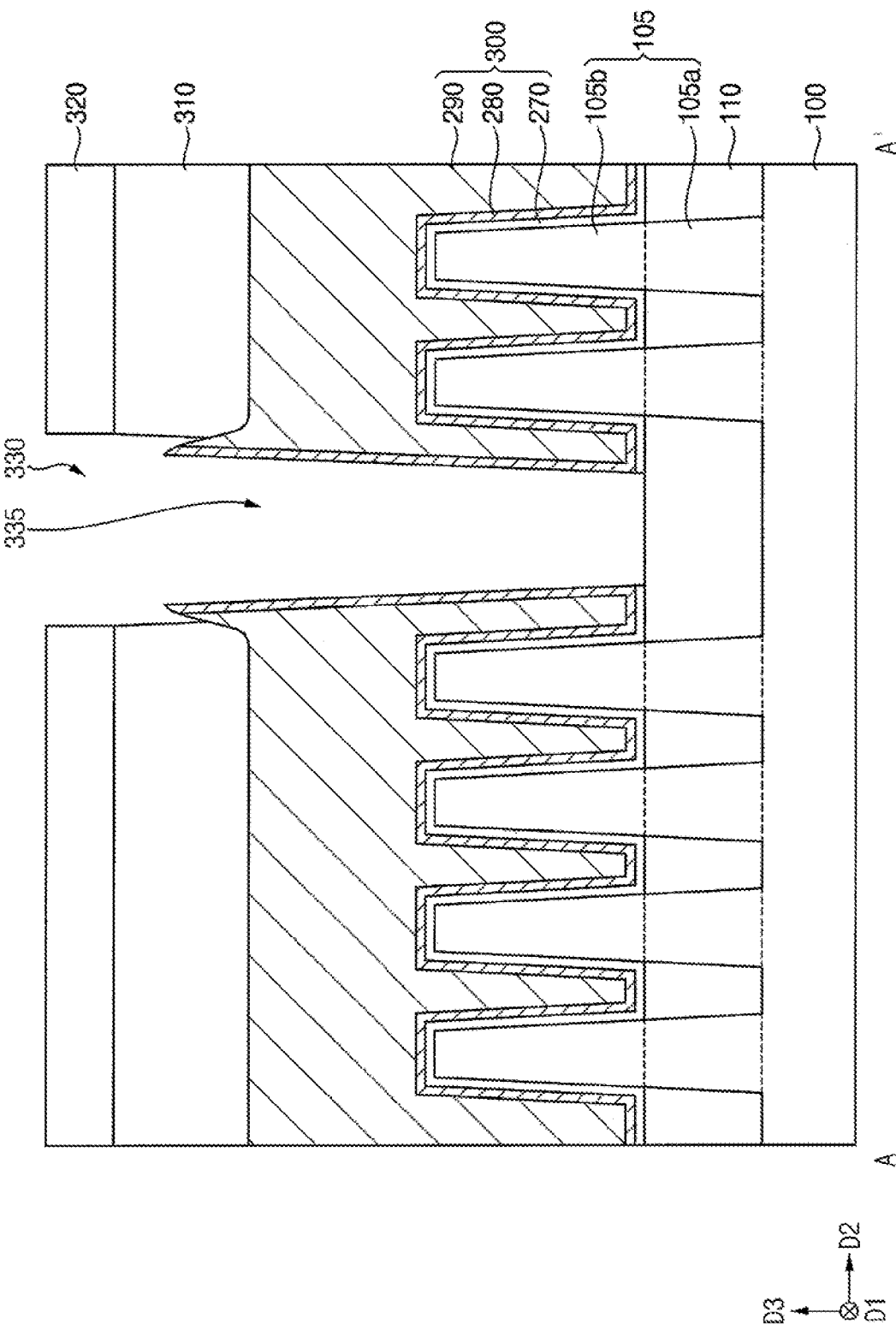
Figure 21:
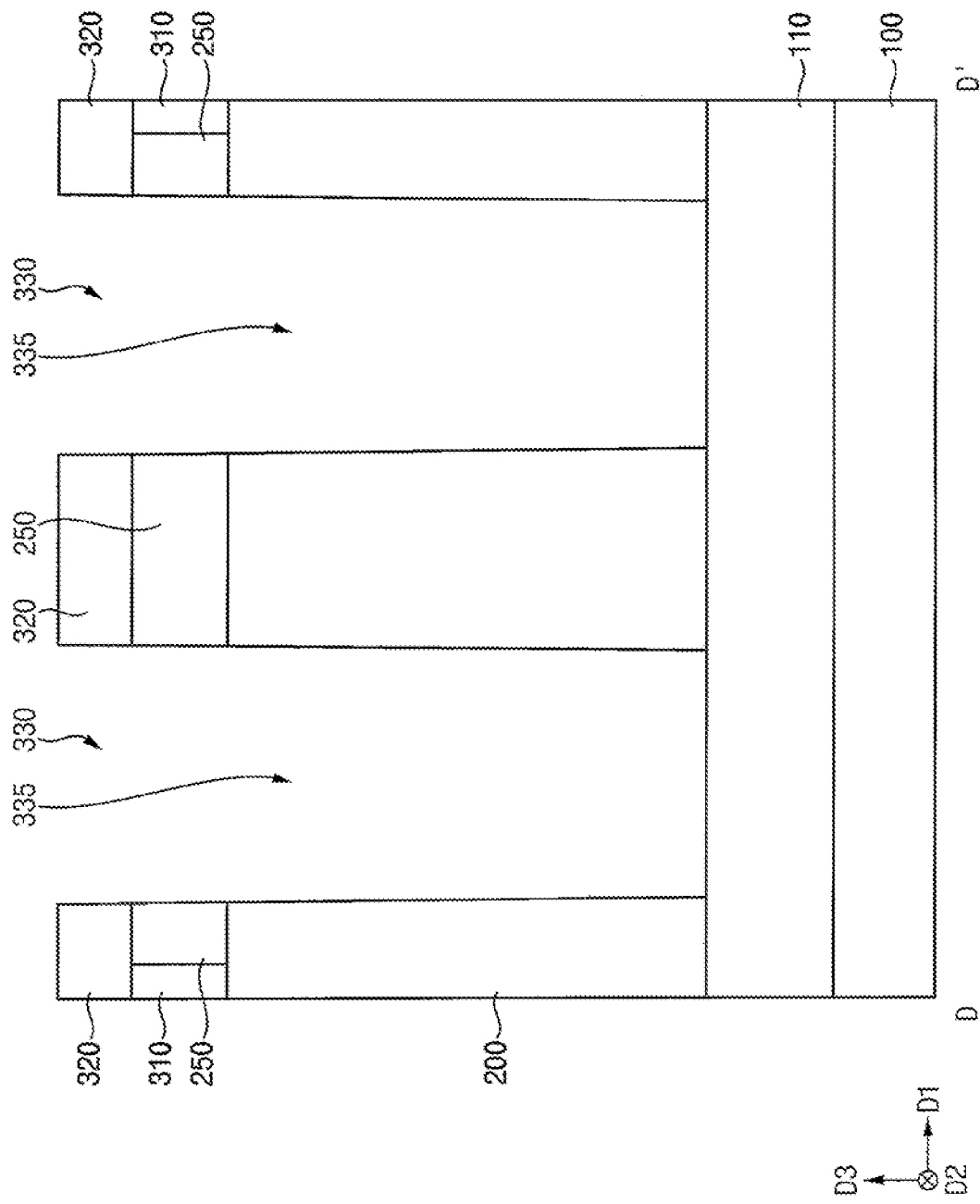

Referring to FIGS. 20 and 21, in some embodiments, a second etching mask 320 is formed on the capping pattern 310 and the horizontal extension portion 250b of the third insulation pattern 250. The second etching mask 320 has a fourth opening that overlaps in the third direction D3 the first and second insulation patterns 230 and 240 of the first division pattern structure 260, and includes, e.g., TEOS. A dry etching process is performed to partially etch the first division pattern structure 260.

Thus, in some embodiments, the first and second insulation patterns 230 and 240 and the vertical extension portion 250a of the third insulation pattern 250 in the second opening 225 and a portion of the horizontal extension portion 250b directly on the vertical extension portion 250a are removed to form a fifth opening 335 that exposing an upper surface of the isolation pattern 110. The fourth opening 330 and the fifth opening 335 form a single opening that penetrates the second etching mask 320 and the capping pattern 310, and extend down to the isolation pattern 110. During the dry etching process, a portion of the gate insulation pattern 270 on the sidewall of the first division pattern structure 260 is removed, while the gate barrier 280 and the gate electrode 290 are not removed. Accordingly, portions of the gate barrier 280 and the gate electrode 290 on sidewalls of the first division pattern structure 260 that are opposite in the second direction D2 protrude upward from other portions of the gate electrode 290.

In some embodiments, the horizontal extension portion 250b of the third insulation pattern 250 in the first division pattern structure 260 partially remain on the first insulating interlayer 200.

Figure 22:
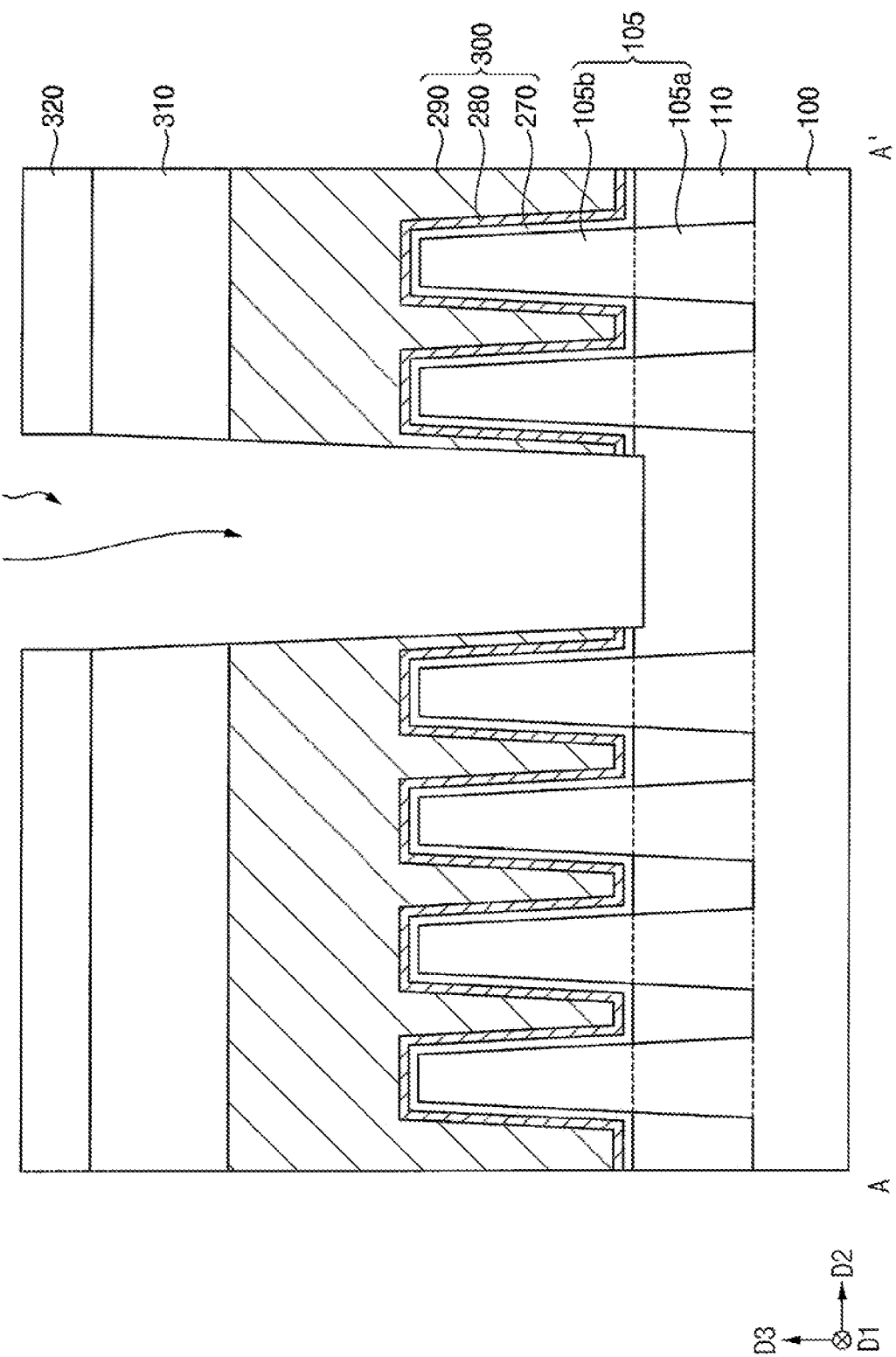
Figure 23:
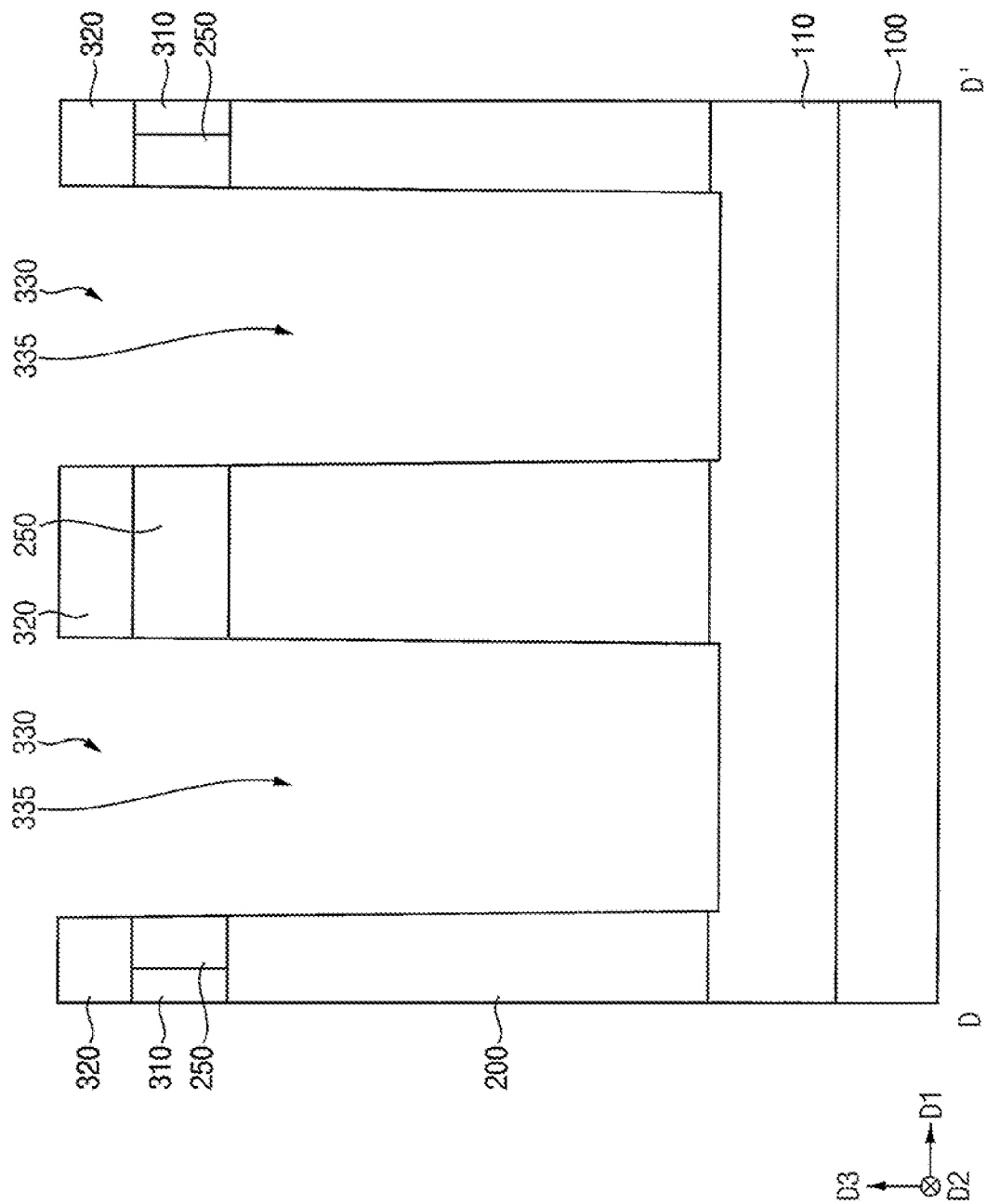

Referring to FIGS. 22 and 23, in some embodiments, a dry etching process is additionally performed using the second etching mask 320 to remove the portions of the gate barrier 280 and the gate electrode 290 on a sidewall of the fifth opening 335.

Thus, in some embodiments, the fifth opening 335 is horizontally enlarged, and the gate structure 300 has a flat upper surface even at an area adjacent to the fifth opening 335. The fifth opening 335 extends into the isolation pattern 110 so that a lower surface of the fifth opening 335 is lower than an upper surface of the isolation pattern 110.

Figure 24:
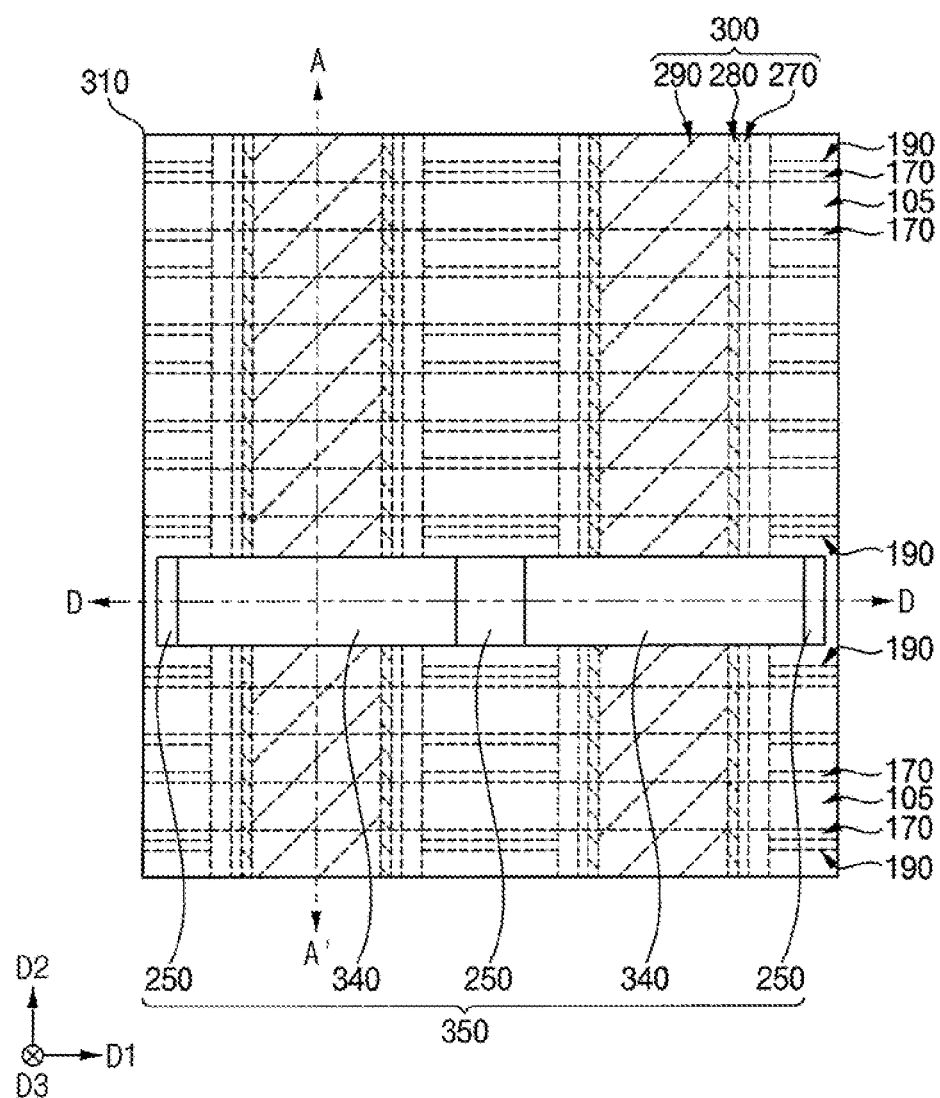
Figure 25:
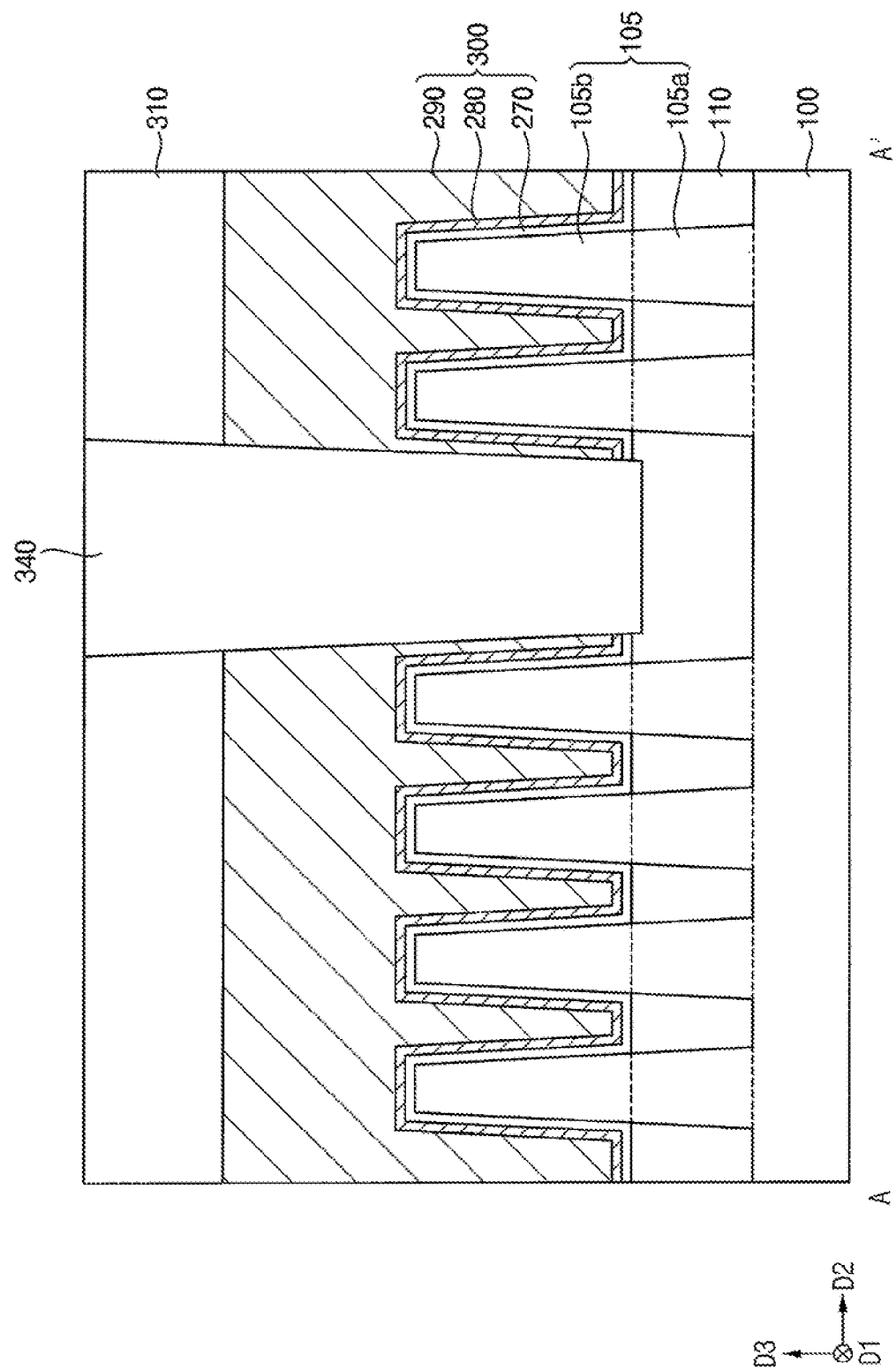
Figure 26:
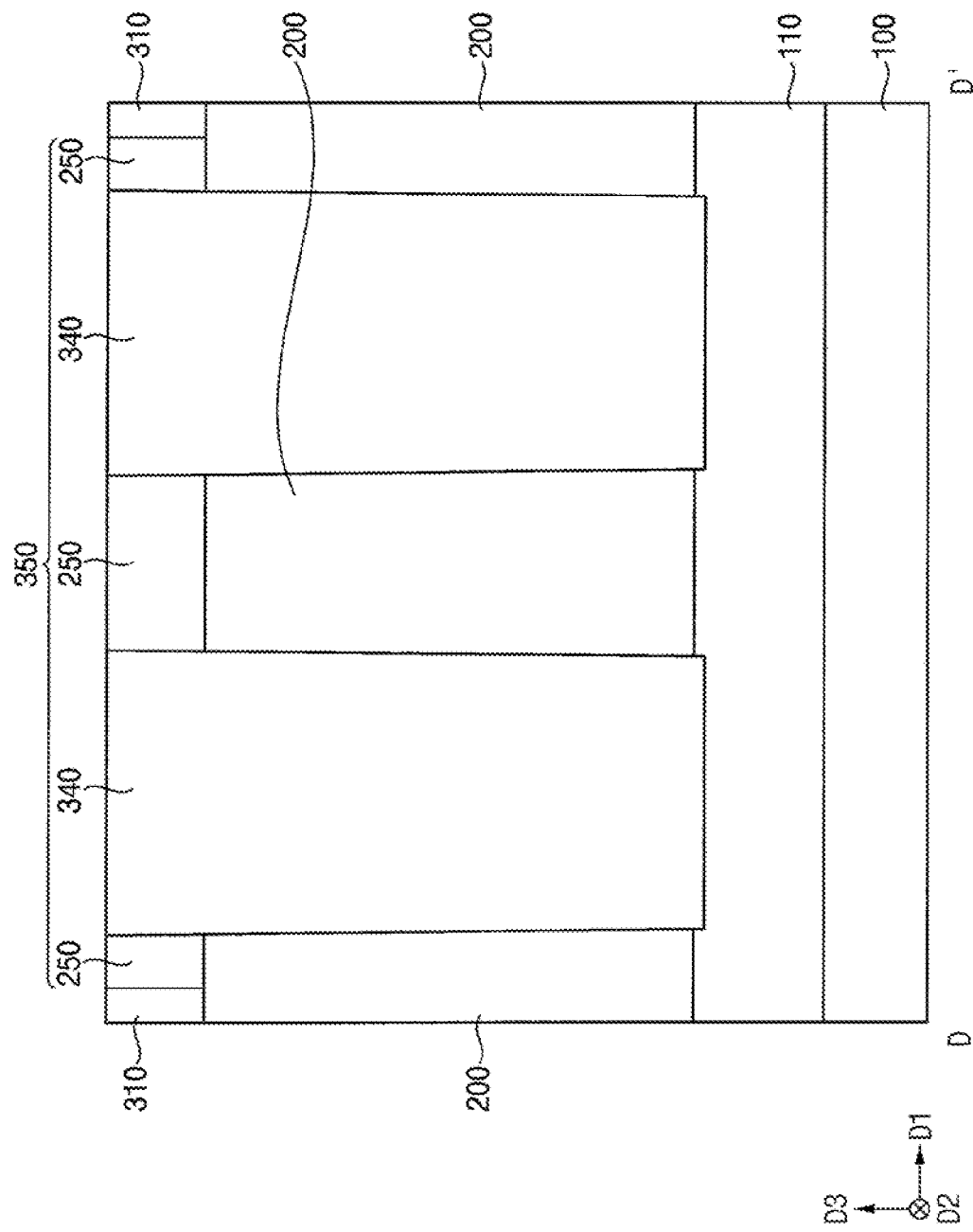
Figure 27:
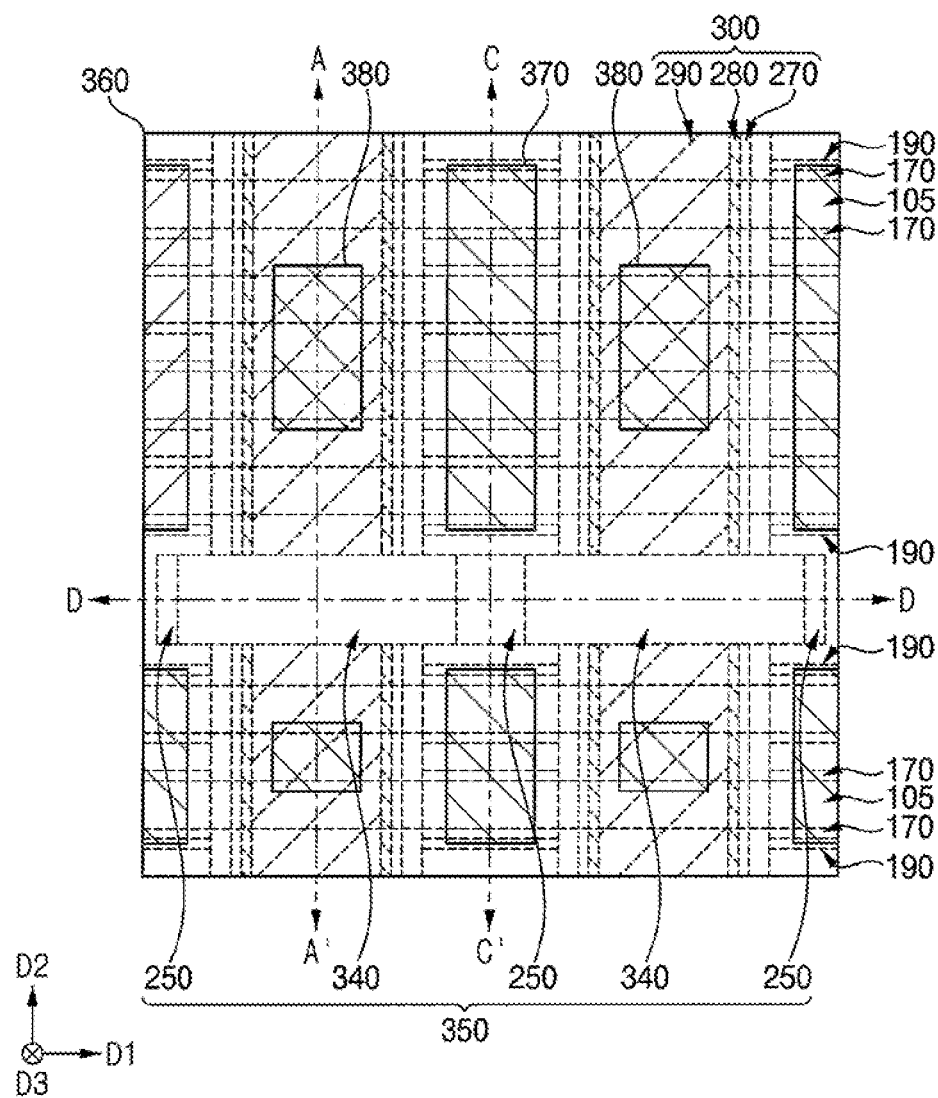
Figure 28:
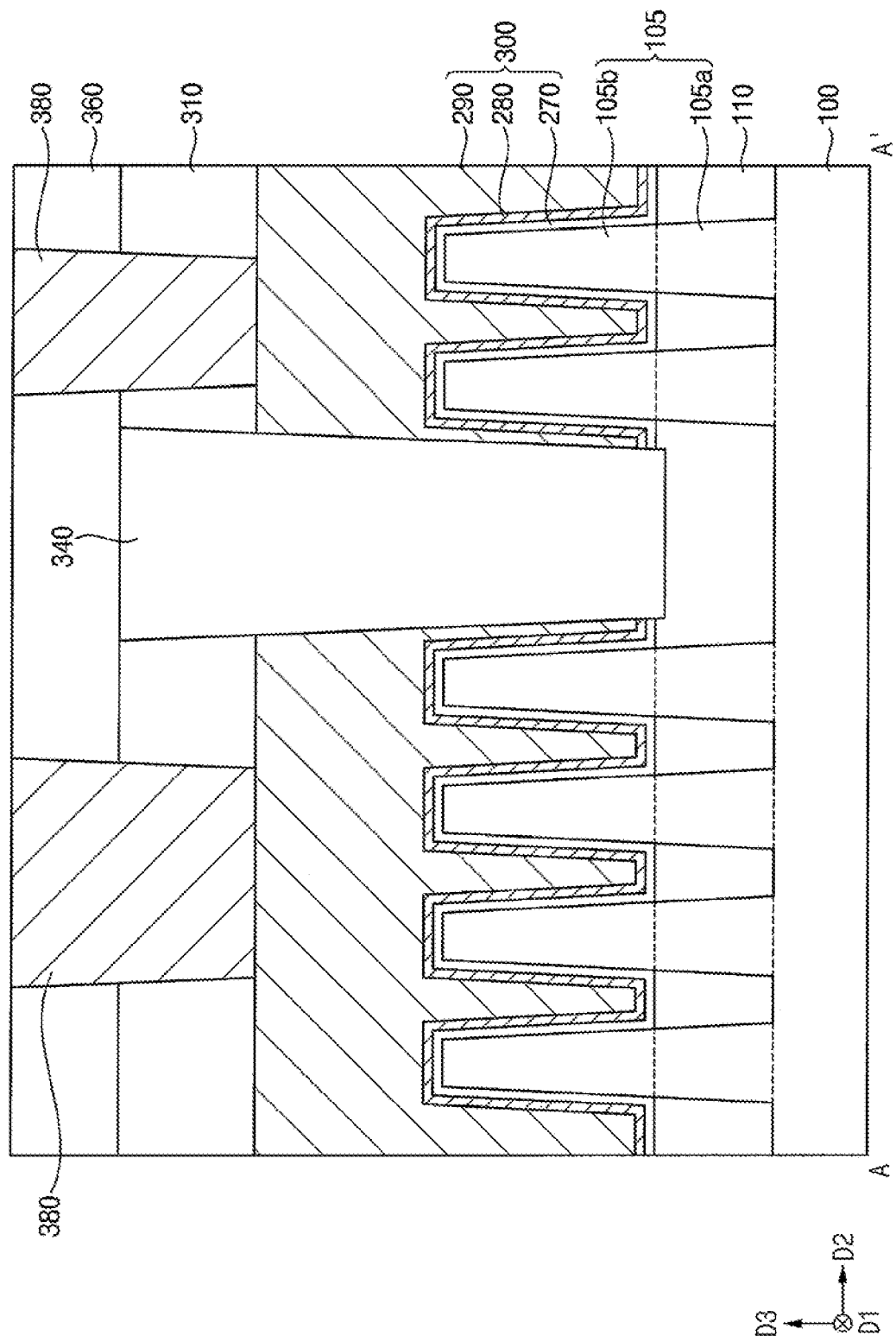
Figure 29:
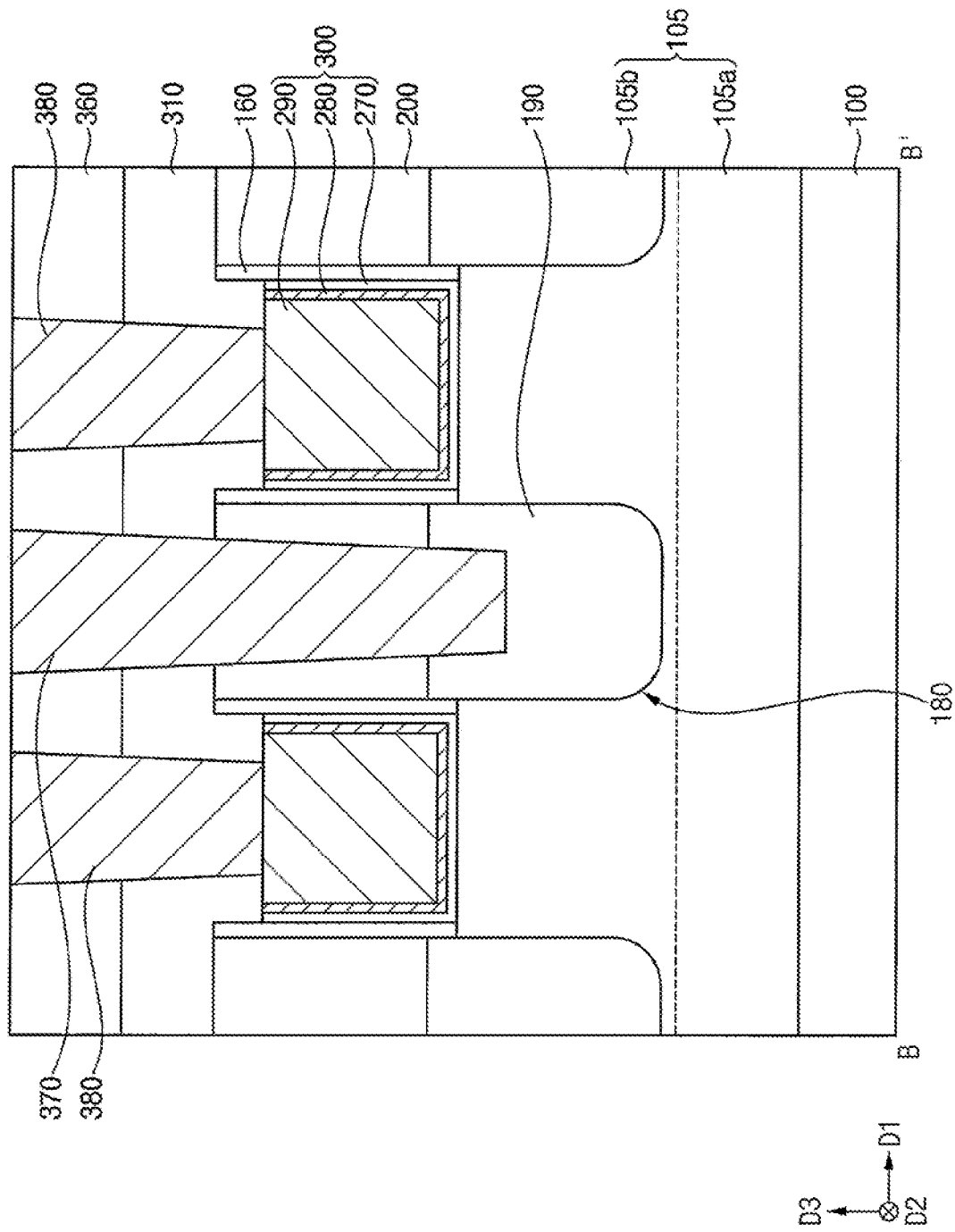

Referring to FIGS. 24 to 26, in some embodiments, a second division pattern 340 is formed in the fifth opening 335.

In some embodiments, the second division pattern 340 is formed by forming a division layer on the isolation pattern 110 and the second etching mask 320 to fill the fourth and fifth openings 330 and 335, planarizing the division layer until upper surfaces of the capping pattern 310 and the horizontal extension portion 250b of the third insulation pattern 250 are exposed, and removing the second etching mask 320.

Thus in some embodiments, a second division pattern structure 350 is formed that includes the second division pattern 340 in the fifth opening 335 and the horizontal extension portion 250b of the third insulation pattern 250 that contacts a sidewall of the second division pattern 340 in the first direction D1.

In some embodiments, the second division pattern 340 includes a nitride, such as silicon nitride.

Referring to FIGS. 27 to 31, in some embodiments, a second insulating interlayer 360 is formed on the capping pattern 310 and the second division pattern structure 350, a first contact plug 370 is formed that extends through the second insulating interlayer 360, the capping pattern 310 and the first insulating interlayer 200 to contact an upper surface of the source/drain layer 190, and a second contact plug 380 is formed that extends through the second insulating interlayer 360 and the capping pattern 310 to contact an upper surface of the gate electrode 290, to complete the fabrication of the semiconductor device.

In some embodiments, the second insulating interlayer 360 includes an oxide, such as silicon oxide. Each of the first and second contact plugs 370 and 380 includes, e.g., a metal, a metal nitride, a metal silicide, or doped polysilicon, etc.

As illustrated above, in some embodiments, the first division pattern structure 260 is formed in the second opening 225 to divide the dummy gate structure 150, the dummy gate structure is replaced with the gate structure 300, and the etching process is performed to remove the first division pattern structure 260. The etching process also removes the portion of the gate structure 300 on the sidewall of the first division pattern structure 260 and that protrudes upward from other portions thereof, and thus the gate structure 300 has a flat upper surface adjacent to the first division pattern structure 260.

If the gate structure 300 includes a conductive material, such as a metal, and does not have a flat upper surface but rather a protruding upper surface adjacent to the first division pattern structure 260, electrical shorts or interference can occur between the gate structure 300 and the first and second contact plugs 370 and 380, which include a conductive material. However, in embodiments, the protruding portion of the gate structure 300 is removed by an additional etching process so that the electrical shorts or interference can be prevented.

If, instead of dividing the dummy gate structure 150 after forming the gate structure 300, an etching process is performed that divides the gate structure 300, a large amount of metal may need to be removed, so that the surface of the metal in the gate structure 300 may oxidize, which can increase the resistance of the gate structure 300.

However, in some embodiments, the first division pattern structure 260 is formed that divides the dummy gate structure 150, the dummy gate structure 150 is replaced with the gate structure 300, and the first division pattern structure 260 and the adjacent portions of the gate structure 300 are removed. Thus, the amount of a metal to be removed to divide the gate structure 300 is small, and thus the surface of the metal in the gate structure 300 is less likely to oxidize. Thus, in the method of manufacturing a semiconductor device in accordance with some embodiments, the gate structure 300, which includes a metal, is easily divided, and the gate structure 300 divided by the above method has enhanced electrical characteristics, such as a low resistance.

A semiconductor device manufactured by an above method may have these structural characteristics.

In particular, a semiconductor device according to some embodiments includes active patterns 105 that are spaced apart from each other in the second direction D2, protrude from the substrate 100 and extend in the first direction D1, and that have a lower sidewall covered by the isolation pattern 110. The gate structures 300 are spaced apart from each other in the first direction D1 and extend in the second direction D2 on the active patterns 105 and the isolation pattern 110. The second division pattern 340 extends through one of the gate structures 300 to divide the gate structures 300 on the isolation pattern 110 and contacts opposite sidewalls of the divided gate structures 300 that face each other in the second direction D2. The source/drain layer 190 is disposed on the active pattern 105 adjacent to each of the gate structures 300. The first contact plug 370 are disposed on and electrically connected to the source/drain layer 190, and the second contact plug 380 is disposed on and electrically connected to each of the gate structures 300.

In some embodiments, each of the gate structures 300 includes the gate insulation pattern 270, the gate barrier 280 and the gate electrode 290 that are sequentially stacked. The gate insulation pattern 270 and the gate barrier 280 are not formed on a sidewall of the second division pattern 340 in the second direction D2, and thus the gate electrode 290 contacts the sidewall of the second division pattern 340. The gate insulation pattern 270, the gate barrier 280 and the gate electrode 290 are sequentially stacked on a portion of the isolation pattern 110 adjacent to the second division pattern 340, and the gate insulation pattern 270 contacts an upper surface of the portion of the isolation pattern 110.

In some embodiments, each of the gate structures 300 has a substantially flat upper surface. Thus, a height of a portion of each of the gate structures 300 is not higher than the heights of other portions of each of the gate structures 300.

In some embodiments, a height of the second division pattern structure 340 is higher than that of each of the gate structures 300.

Figure 32:
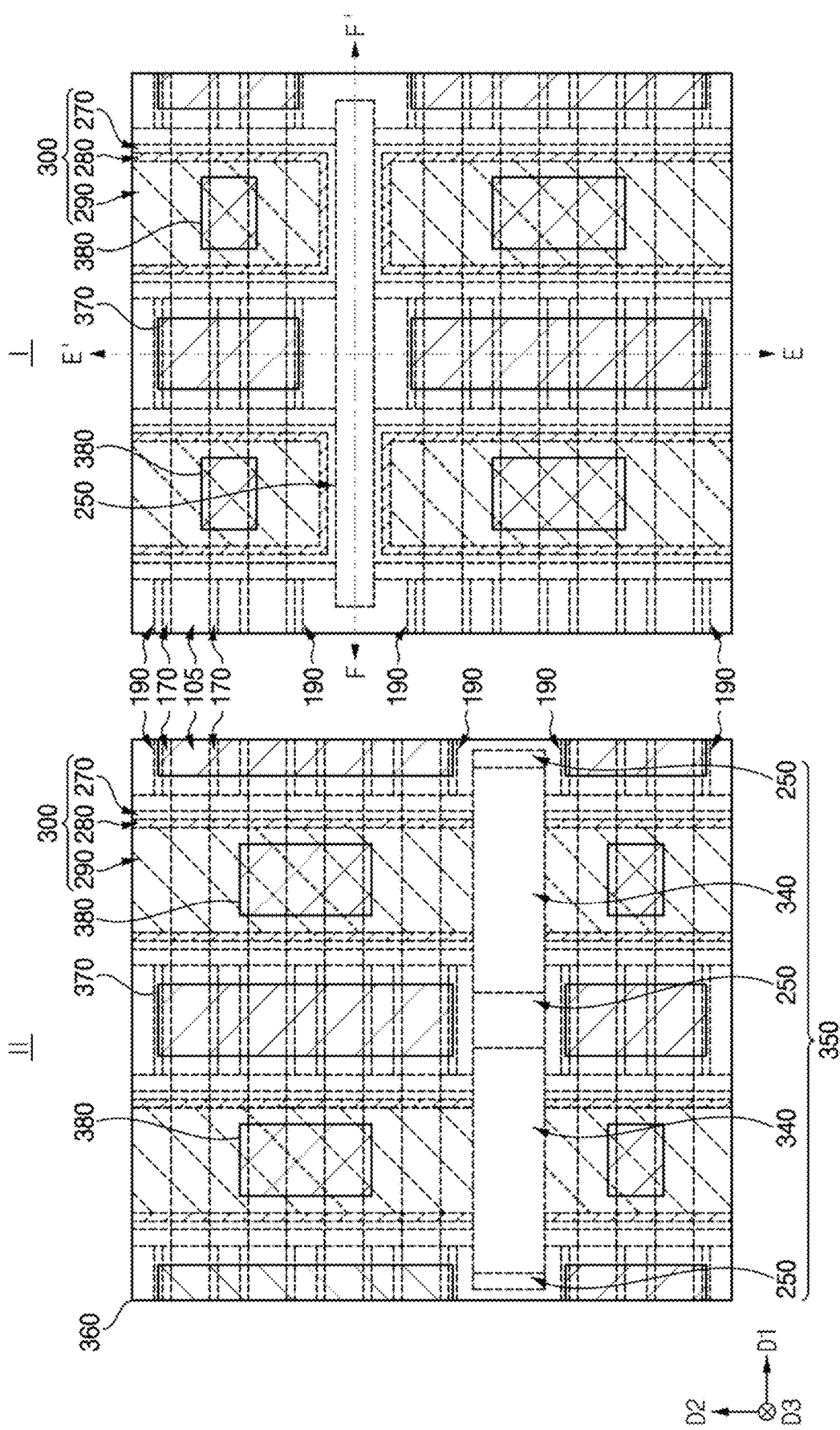

FIGS. 32 to 34 are a plan view and cross-sectional views of a semiconductor device in accordance with some embodiments. In particular, FIG. 32 is a plan view, FIG. 33 is a cross-sectional view taken along line E-E' of FIG. 32, and FIG. 34 is a cross-sectional view taken along line F-F' of FIG. 32.

In some embodiments, a semiconductor device further includes the first division pattern structure 260 illustrated with reference to FIGS. 16 to 19 in addition to the second division pattern structure 350 illustrated with reference to FIGS. 27 to 31.

Referring to FIGS. 32 to 34, in some embodiments, the substrate 100 includes first and second regions I and II. The active patterns 105 and the gate structures 300 on the first region I of the substrate 100 may be referred to as first active patterns and first gate structures, respectively, and the active patterns 105 and the gate structures 300 on the second region II of the substrate 100 may be referred to as second active patterns and second gate structures, respectively.

In some embodiments, a semiconductor device shown in FIGS. 27 to 31 is formed on the second region II of the substrate 100. Each of the first gate structures 300 on the first region I of the substrate 100 is divided in the second direction D2 by the first division pattern structure 260, and the first division pattern structure 260 is not replaced with the second division pattern structure 350 by processes illustrated with reference to FIGS. 20 to 26. Thus, an uppermost surface of a portion of each of the first gate structures 300 on a sidewall of the first division pattern structure 260 are higher than an uppermost surface of a portion of each of the second gate structures on a sidewall of the second division pattern structure 350.

In some embodiments in the first region I of the substrate 100 on which each of the first gate structures 300 is divided by the first division pattern structure 260, a distance between each of the first gate structures 300 and the first contact plug 370 is relatively great, so that electrical shorts or interference therebetween does not easily occur. Thus, even though the portion of each of the first gate structures on the sidewall of the first division pattern structure 260 protrude upward, electrical shorts or interference do not occur.

In some embodiments in the second region II of the substrate 100 on which each of the second gate structures 300 is divided by the second division pattern structure 350, a distance between each of the second gate structures 300 and the first contact plug 370 is relatively small, so that electrical shorts or interference therebetween can easily occur. However, in accordance with embodiments, the portion of each of the second gate structures 300 on the sidewall of the second division pattern structure 350 do not protrude upward, and each of the second gate structures has a flat upper surface. Accordingly, electrical shorts or interference between each of the second gate structures and the first contact plug 370 does not occur.

In some embodiments, the first region I of the substrate 100 is a logic region in which logic devices are formed, and the second region II of the substrate 100 is an SRAM region in which SRAM devices are formed.

A semiconductor device according to some embodiments can be incorporated into various types of memory devices and/or systems that include contact plugs. For example, a semiconductor device can be used with contact plugs in a logic device such as a central processing unit (CPU), an application processor (AP), etc. Alternatively, a semiconductor device can be used with contact plugs in a peripheral circuit region or a cell region used in a volatile memory device such as a DRAM device, an SRAM device, etc., or in a non-volatile memory device such as a flash memory device, a PRAM device, an MRAM device, or an RRAM device, etc.

The foregoing is illustrative of embodiments and is not to be construed as limiting thereof. Although some embodiments have been described, those skilled in the art will readily appreciate that many modifications are possible in embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   first and second active patterns disposed on first and second regions of a substrate, respectively, wherein each of the first and second active patterns protrudes from the substrate and extends in a first direction substantially parallel to an upper surface of the substrate;
   an isolation pattern disposed on the substrate and that covers lower sidewalls of the first and second active patterns;
   a first gate structure that extends in a second direction on the first active patterns and the isolation pattern, wherein the second direction is substantially parallel to the upper surface of the substrate and crosses the first direction;
   a second gate structure that extends in the second direction on the second active patterns and the isolation pattern;
   a first division pattern structure disposed on the first region of the substrate, wherein the first division pattern structure contacts a sidewall of an end portion in the second direction of the first gate structure; and a second division pattern disposed on the second region of the substrate, wherein the second division pattern contacts a sidewall of an end portion in the second direction of the second gate structure, wherein an uppermost surface of the first gate structure is higher than an uppermost surface of the second gate structure, wherein an upper surface of a portion of the first gate structure on the sidewall of the first division pattern structure is higher than upper surfaces of other portions of the first gate structure.

2. The semiconductor device as claimed in claim 1, wherein an upper surface of the second gate structure is substantially flat.

3. The semiconductor device as claimed in claim 1, wherein the first division pattern structure includes a first insulation pattern, a second insulation pattern and a third insulation pattern that are sequentially stacked.

4. The semiconductor device as claimed in claim 3, wherein each of the first and second insulation patterns has a concave upper surface, and the third insulation pattern has a flat upper surface.

5. The semiconductor device as claimed in claim 3, wherein:
the first gate structure is one of a plurality of first gate structures that are spaced apart from each other in the first direction,
each of the first and second insulation patterns contacts a sidewall of a corresponding first gate structure of the plurality of first gate structures, and
the third insulation pattern includes:
vertical extension portions that contact the sidewalls of the first gate structures, and
a horizontal extension portion that commonly contacts upper surfaces of the vertical extension portions.

6. The semiconductor device as claimed in claim 1, wherein the first gate structure includes a gate insulation pattern, a gate barrier and a gate electrode that are sequentially stacked, and
wherein the gate insulation pattern contacts the sidewall of the first division pattern structure.

7. The semiconductor device as claimed in claim 1, wherein the first gate structure includes a gate insulation pattern, a gate barrier and a gate electrode that are sequentially stacked, and
wherein the gate insulation pattern and the gate barrier are not formed on the sidewall of the second division pattern, and the gate electrode contacts the sidewall of the second division pattern.

8. A semiconductor device, comprising:
first and second active patterns disposed on first and second regions of a substrate, respectively, wherein each of the first and second active patterns protrudes from the substrate and extends in a first direction substantially parallel to an upper surface of the substrate;
an isolation pattern disposed on the substrate and that covers lower sidewalls of the first and second active patterns;
a first gate structure that extends in a sedond direction on the first active patterns and the isolation pattern, wherein the second direction is substantially parallel to the upper surface of the substrate and crosses the first direction;
a second gate structure that extends in the second direction on the second drive patterns and the isolation pattern;

a first division pattern structure disposed on the first region of the substrate, wherein the first division pattern structure contacts a sidewall of an end portion in the second direction of the first gate structure; and a second division pattern disposed on the second region of the substrate, wherein the second division pattern contacts a sidewall of an end portion in the second direction of the second gate structure, wherein an uppermost surface of the first gate structure is higher than an uppermost surface of the second gate structure, and wherein the upper surface of the portion of the first gate structure on the sidewall of the first division pattern structure is lower than an upper surface of the first division pattern structure.

9. The semiconductor device as claimed in claim 8, wherein the first division pattern structure includes a first insulation pattern, a second insulation pattern and a third insulation pattern that are sequentially stacked.

10. The semiconductor device as claimed in claim 9, wherein each of the first and second insulation patterns has a concave upper surface, and the third insulation pattern has a flat upper surface.

11. The semiconductor device as claimed in claim 8, wherein the first gate structure includes a gate insulation pattern, a gate barrier and a gate electrode that are sequentially stacked, and
wherein the gate insulation pattern contacts the sidewall of the first division pattern structure.

12. The semiconductor device as claimed in claim 8, wherein the first gate structure includes a gate insulation pattern, a gate barrier and a gate electrode that are sequentially stacked, and
wherein the gate insulation pattern and the gate barrier are not formed on the sidewall of the second division pattern, and the gate electrode contacts the sidewall of the second division pattern.

13. A semiconductor device, comprising:
first and second active patterns disposed on first and second regions of a substrate, respectively, wherein each of the first and second active patterns protrudes from the substrate and extends in a first direction substantially parallel to an upper surface of the substrate;
an isolation pattern disposed on the substrate and that covers lower sidewalls of the first and second active patterns;
a first gate structure that extends in a second direction on the first active patterns and the isolation pattern, wherein the second direction is substantially parallel to the upper surface of the substrate and crosses the first direction;
a second gate structure that extends in the second direction on the second active patterns and the isolation pattern;
a first division pattern structure disposed on the first region of the substrate, wherein the first division pattern structure contacts a sidewall of an end portion in the second direction of the first gate structure, wherein the first division pattern structure includes a first insulation pattern, a second insulation pattern and a third insulation pattern that are sequentially stacked; and
a second division pattern disposed on the second region of the substrate, wherein the second division pattern contacts a sidewall of an end portion in the second direction of the second gate structure, wherein an uppermost surface of the first gate structure is higher than an uppermost surface of the second gate structure, the first gate structure is one of a plurality of first gate structures that are spaced apart from each other in the first direction, each of the first and second insulation patterns contacts a sidewall of a corresponding first gate structure of the plurality of first gate structures, and the third insulation pattern includes: vertical extension portions that contact the sidewalls of the first gate structures, and a horizontal extension portion that commonly contacts upper surfaces of the vertical extension portions.

14. The semiconductor device as claimed in claim 13, wherein an upper surface of the second gate structure is substantially flat.

15. The semiconductor device as claimed in claim 13, wherein each of the first and second insulation patterns has a concave upper surface, and the third insulation pattern has a flat upper surface.

16. The semiconductor device as claimed in claim 13,
wherein the first gate structue includes a gate insulation pattern, a gate barrier and a gate electrode that are sequentially stacked, and wherein the gate insulation pattern contacts the sidewall of the first division pattern structure.

17. The semiconductor device as claimed in claim 13,
wherein the first gate structure includes a gate insulation patter, a gate barrier and a gate electrode that are sequentially stacked, and wherein the gate insulation pattern and the gate barrier are not formed on the sidewall of the second division pattern, and the gate electrode contacts the sidewall of the second division pattern.

* * * * *